US012745519B2

(12) United States Patent
Huang et al.

(10) Patent No.: US 12,745,519 B2

(45) **Date of Patent: *Sep. 22, 2026**

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yao Huang, Beijing (CN); Weiyun Huang, Beijing (CN); Yue Long, Beijing (CN); Binyan Wang, Beijing (CN); Guobo Yang, Beijing (CN); Benlian Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 933 days.

This patent is subject to a terminal disclaimer.

(21) Appl. No.: 17/936,533

(22) Filed: Sep. 29, 2022

(65) Prior Publication Data

US 2024/0114731 A1 Apr. 4, 2024

Related U.S. Application Data

(63) Continuation of application No. 17/760,461, filed as application No. PCT/CN2021/094383 on May 18, 2021.

(30) Foreign Application Priority Data

Jun. 4, 2020 (CN) ........................ 202010498518.8

(51) Int. Cl.
*H10K 59/131* (2023.01)
*H04M 1/02* (2006.01)
(Continued)

(52) U.S. Cl.
CPC ........ *H10K 59/131* (2023.02); *H04M 1/0266* (2013.01); *H10D 86/441* (2025.01);
(Continued)

(58) Field of Classification Search
CPC ....... H10K 59/131–1315; H10K 59/12; H10K 59/35–353; H10K 59/122; H10K 59/123;
(Continued)

(56) References Cited

U.S. PATENT DOCUMENTS 10,707,281 B2 7/2020 Kuo et al.
2020/0052048 A1* 2/2020 Kuo ...................... G06F 1/1605
(Continued)

FOREIGN PATENT DOCUMENTS

CN 108807487 A 11/2018
CN 110265458 A 9/2019
(Continued)

OTHER PUBLICATIONS

The Extended European Search Report dated Sep. 1, 2023; Appln. No. 21818977.7.

*Primary Examiner* — Sue A Purvis
*Assistant Examiner* — Aneta B Cieslewicz

(57) ABSTRACT

A display panel and a display device, the display panel comprising: a first display region; a second display region, at least partially positioned on one side of the first display region; a plurality of pixel units, the density of pixel units in the first display region being less than the density of pixel units in the second display region, and the pixel units comprising pixel circuits; and first power supply lines, configured to supply a first voltage signal to the pixel
(Continued)

circuits. The first power supply lines comprise a plurality of first wires, a plurality of second wires, and a plurality of third wires, the first wires extending from the second display region to the first display region, the plurality of second wires being positioned in the first display region, positioned between adjacent first wires, and extending in a first direction, and the third wires extending along a second direction, the first direction intersecting with the second direction. The third wires extend from the second display region to the first display region, and adjacent second wires are spaced apart in the first direction. The second wires being connected to the first wires by means of the third wires.

20 Claims, 24 Drawing Sheets

(51) Int. Cl.
*H10D 86/40* (2025.01)
*H10D 86/60* (2025.01)
*H10K 59/35* (2023.01)

(52) U.S. Cl.
CPC .......... *H10D 86/60* (2025.01); *H04M 1/0264* (2013.01); *H10K 59/351* (2023.02)

(58) Field of Classification Search
CPC ... H10D 86/441; H10D 86/60; H04M 1/0266; H04M 1/0264
See application file for complete search history.

(56) References Cited

U.S. PATENT DOCUMENTS

| | | | |
|---|---|---|---|
| 2020/0066809 | A1 | 2/2020 | Liu |
| 2020/0411611 | A1 | 12/2020 | Liu et al. |
| 2021/0313405 | A1 | 10/2021 | Xu et al. |

FOREIGN PATENT DOCUMENTS

| | | | | | |
|---|---|---|---|---|---|
| CN | 110278300 | A | | 9/2019 | |
| CN | 110288915 | A | | 9/2019 | |
| CN | 110288945 | A | | 9/2019 | |
| CN | 110649085 | A | | 1/2020 | |
| CN | 110767097 | A | * | 2/2020 | .......... H10K 59/131 |
| CN | 110767662 | A | | 2/2020 | |
| CN | 110854178 | A | | 2/2020 | |
| CN | 111028765 | A | | 4/2020 | |
| KR | 20160056650 | A | | 5/2016 | |

* cited by examiner

102/P0
101/P0
P1
103/P0
104/P0
R2
D2
D1

LY3

ISL2

V1/V10
V1/V20
V1/V30
V1/V40

DISPLAY PANEL AND DISPLAY DEVICE

CROSS-REFERENCE TO RELATED APPLICATIONS

For all purposes, this patent application is a continuation application of U.S. Ser. No. 17/760,461 filed on Aug. 10, 2022 which claims priority to the Chinese Patent Application No. 202010498518.8 filed in China on Jun. 4, 2020, which is incorporated herein by reference in its entirety as part of the embodiment of the present disclosure.

TECHNICAL FIELD

At least one embodiment of the present disclosure relates to a display panel and a display device.

BACKGROUND

Based on a design of an under-screen camera, a display panel generally includes a high Pixels Per Inch (PPI) region and a low PPI region, but generally, the display panel has relatively low light transmittance in the low PPI region, which is not beneficial for improving a display effect of the camera in an imaging region.

SUMMARY

At least one embodiment of the present disclosure relates to a display panel and a display device.

At least one embodiment of the present disclosure provides a display panel, including: a first display region; a second display region, located at least on one side of the first display region; a plurality of pixel units, located in the first display region and the second display region, a density of pixel units in the first display region being less than that of pixel units in the second display region, and each of the plurality of pixel units including a pixel circuit; and a first power supply line, configured to supply a first voltage signal to the pixel circuit; the first power supply line includes a plurality of first conductive lines, a plurality of second conductive lines, and a plurality of third conductive lines, each of the plurality of first conductive lines extends from the second display region to the first display region, each of the plurality of second conductive lines is located in the first display region and located between adjacent ones of the plurality of first conductive lines, each of the plurality of second conductive lines extends in a first direction, each of the plurality of third conductive lines extends in a second direction, and the first direction intersects with the second direction, the third conductive line extends from the second display region to the first display region, and adjacent ones of the plurality of second conductive lines are spaced apart from each other in the first direction, and the second conductive line is connected with the first conductive line by the third conductive line.

According to the display panel provided by some embodiments of the present disclosure, the plurality of second conductive lines are sequentially arranged in the first direction.

According to the display panel provided by some embodiments of the present disclosure, the adjacent ones of the plurality of second conductive lines are not directly connected.

According to the display panel provided by some embodiments of the present disclosure, a length of a part of the first conductive line located in the first display region in the first direction is greater than that of the second conductive line in the first direction.

According to the display panel provided by some embodiments of the present disclosure, the first conductive line includes parts located in different layers, and the parts located in the different layers are connected through a via hole that penetrates an insulation layer.

According to the display panel provided by some embodiments of the present disclosure, the first power supply line further includes a fourth conductive line, the fourth conductive line extends in the second direction, the second conductive line is connected to the first conductive line by the fourth conductive line, and a length of the fourth conductive line in the second direction is less than or equal to that of the third conductive line in the second direction.

According to the display panel provided by some embodiments of the present disclosure, a plurality of fourth conductive lines are provided, the plurality of fourth conductive lines are located between adjacent ones of the plurality of third conductive lines, and the plurality of fourth conductive lines are sequentially arranged in the second direction, and adjacent ones of the plurality of fourth conductive lines are spaced apart from each other in the second direction.

According to the display panel provided by some embodiments of the present disclosure, a part of the first conductive line is located in a same layer as the third conductive line, and the fourth conductive line is located in a same layer as the third conductive line.

According to the display panel provided by some embodiments of the present disclosure, the pixel units in the first display region constitute a plurality of pixel islands, each of the plurality of pixel islands at least includes two pixels located in two adjacent rows, the first conductive line and the second conductive line overlap with the two pixel units located in the two adjacent rows, respectively.

According to the display panel provided by some embodiments of the present disclosure, the pixel unit further includes a light-emitting element, the pixel circuit includes a first transistor and a second transistor, the first transistor is connected with the second transistor, and the second transistor is connected with the light-emitting element, the first transistor includes a first channel and a second channel, the first channel and the second channel are connected by a conductive portion, and the second conductive line further includes a connection arm, the connection arm and the conductive portion of one pixel unit in the pixel island that overlaps with the second conductive line are spaced apart from each other in a third direction, and partially overlap with each other in the third direction, and the third direction is perpendicular to the first direction, and is perpendicular to the second direction.

According to the display panel provided by some embodiments of the present disclosure, a shape of the connection arm includes a C shape.

According to the display panel provided by some embodiments of the present disclosure, the first conductive line has a branch, and the branch and the conductive portion of one pixel unit in the pixel island that overlaps with the first conductive line are spaced apart from each other in the third direction, and partially overlap with each other in the third direction.

According to the display panel provided by some embodiments of the present disclosure, the first direction is perpendicular to the second direction.

According to the display panel provided by some embodiments of the present disclosure, the first power supply line further includes a fifth conductive line, the fifth conductive line extends in the first direction, and the fifth conductive line is located in the second display region, the fifth conductive line is located between adjacent ones of the plurality of first conductive lines, and the fifth conductive line and the second conductive line adjacent thereto are spaced apart from each other in the first direction.

According to the display panel provided by some embodiments of the present disclosure, the display panel further includes an initialization signal line configured to supply an initialization signal to the pixel circuit, the second conductive line is surrounded by a part of the initialization signal line.

According to the display panel provided by some embodiments of the present disclosure, the first conductive line includes a first part and a second part, the first part of the first conductive line is located in a same layer as the second conductive line, and the second part of the first conductive line is not located in a same layer as the second conductive line, and the first part of the first conductive line is surrounded by the part of the initialization signal line.

According to the display panel provided by some embodiments of the present disclosure, the first part of the first conductive line has a first sub-portion extending in the first direction and a second sub-portion extending in the second direction, the second sub-portion has a branch, and the branch extends in the first direction.

According to the display panel provided by some embodiments of the present disclosure, a length of the branch in the first direction is less than that of the first sub-portion in the first direction.

According to the display panel provided by some embodiments of the present disclosure, the pixel unit further includes a light-emitting element, the pixel circuit includes a first transistor and a second transistor, the first transistor is connected with the second transistor, the second transistor is connected with the light-emitting element, the first transistor includes a first channel and a second channel, the first channel and the second channel are connected by a conductive portion, the branch and the conductive portion of one pixel unit in the pixel island that overlaps with the first conductive line are spaced apart from each other in the third direction, and partially overlap with each other in the third direction, and the third direction is perpendicular to the first direction, and is perpendicular to the second direction.

According to the display panel provided by some embodiments of the present disclosure, the second conductive line further includes a connection arm, the connection arm and the conductive portion of one pixel unit in the pixel island that overlaps with the second conductive line are spaced apart from each other in the third direction, and partially overlap with each other in the third direction.

According to the display panel provided by some embodiments of the present disclosure, the display panel further includes a base substrate and a data line, the data line is configured to supply a data signal to the pixel circuit, and the data line includes a first data line, the first data line extends from the first display region to the second display region, and an orthographic projection of the first data line partially overlaps with an orthographic projection of the third conductive line on the base substrate.

According to the display panel provided by some embodiments of the present disclosure, the first data line includes a first part and a second part, and the first part of the first data line partially overlaps with the third conductive line, the second part of the first data line does not overlap with the third conductive line, and the first part of the first data line and the second part of the first data line are located in different layers, respectively.

According to the display panel provided by some embodiments of the present disclosure, a light transmission region is provided between adjacent ones of the plurality of pixel islands, and the first part of the first data line is located between the adjacent ones of the plurality of pixel islands.

According to the display panel provided by some embodiments of the present disclosure, two first data lines are provided, the two first data lines are connected with two adjacent columns of pixel units, respectively, and orthographic projections of the two first data lines partially overlap with an orthographic projection of a same third conductive line on the base substrate.

According to the display panel provided by some embodiments of the present disclosure, the display panel further includes a gate line, the gate line is configured to supply a scan signal to a row of pixel units, the gate line includes a first gate line, the first gate line extends from the second display region to the first display region, and the light transmission region is defined by two adjacent first gate lines and two adjacent first data lines.

At least one embodiment of the present disclosure provides a display device, including any one of the display panels as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure without constituting any limitation thereto.

DETAILED DESCRIPTION

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

In a typical display panel, whether in a high PPI region or in a low PPI region, each first power supply line is of a meshed structure. In order to improve light transmittance of the low PPI region and improve a display effect of a camera in an imaging region, a display panel provided by an embodiment of the present disclosure optimizes a signal line in the low PPI region, for example, the embodiment of the present disclosure optimizes conductive lines of a meshed first power supply line that are arranged horizontally and vertically, to achieve higher transmittance.

Figure 1A:
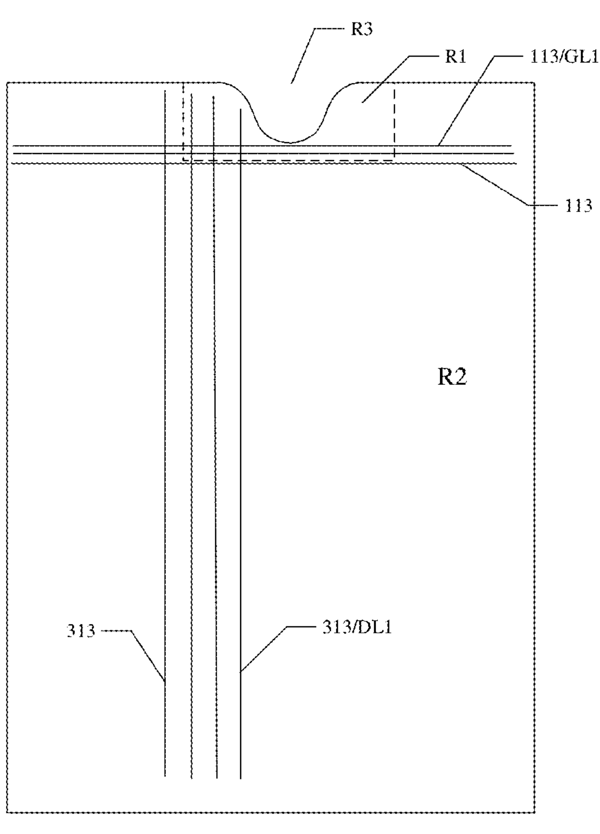
FIG. 1A to FIG. 1C are schematic diagrams of a display panel provided by some embodiments of the present disclosure.
Figure 1B:
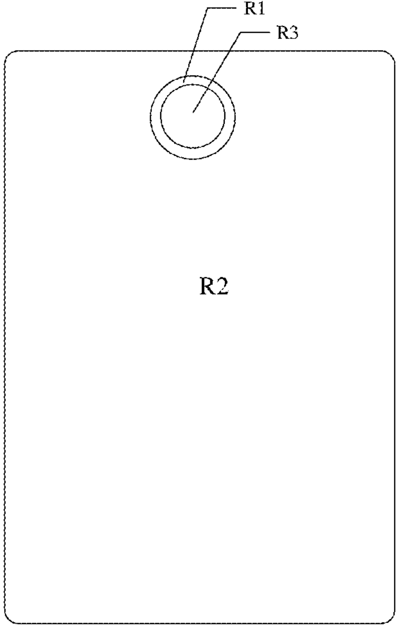
Figures 1C, 2:
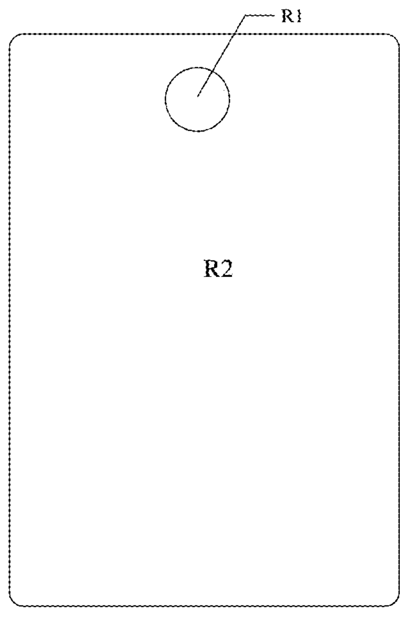
FIG. 2 is a schematic diagram of a second display region of a display panel provided by an embodiment of the present disclosure.

FIG. 1A to FIG. 1C are schematic diagrams of a display panel provided by some embodiments of the present disclosure. As illustrated in FIG. 1A to FIG. 1C, the display panel includes a first display region R1 and a second display region R2. The second display region R2 is a high Pixels Per Inch (PPI) region, and the first display region R1 is a low PPI region. The first display region R1 is a partial light transmission region. As illustrated in FIG. 1A to FIG. 1C, the second display region R2 is located at least on one side of the first display region R1. The display panel illustrated in FIG. 1A and FIG. 1B further includes a third region R3. A sensor such as a camera may be provided in the first display region R1 (as illustrated in FIG. 1C), or in the first display region R1 and the third region R3 (as illustrated in FIG. 1A and FIG. 1B). The third region R3 illustrated in FIG. 1A and FIG. 1B may be a through hole region, that is, a material in a position corresponding to the third region R3 is removed to form a through hole. The sensor can receive ambient light. Taking the sensor being a camera as an example, an under-screen camera is implemented, such that when a screen is used normally, the first display region corresponding to the sensor can display an image normally, and when the camera is shooting, the ambient light can pass through the first display region, which supports normal use. For example, the sensor is provided on a non-display side of the display panel. The sensor may also be referred to as an under-screen component.

FIG. 1A further illustrates a plurality of gate lines 113 and a plurality of data lines 313. The plurality of gate lines 113 include a first gate line GL1, and the plurality of data lines 313 includes a first data line DL1. The first gate line GL1 extends from the second display region R2 to the first display region RE The first data line DL1 extends from the first display region R1 to the second display region R2. In an embodiment of the present disclosure, a certain element extending from the first display region R1 to the second display region R2 can be understood as that the element is located in the first display region R1 and the second display region R2, or it can be said that a certain element extends from the second display region R2 to the first display region R1. For the sake of clear illustration, FIG. 1A schematically illustrates several gate lines 113 and several data lines 313, and the number of the gate lines 113 and the number of the data lines 313 can be determined as required. The plurality of gate lines 113 and the plurality of data lines 313 intersect with each other and are insulated from each other.

Figure 3:
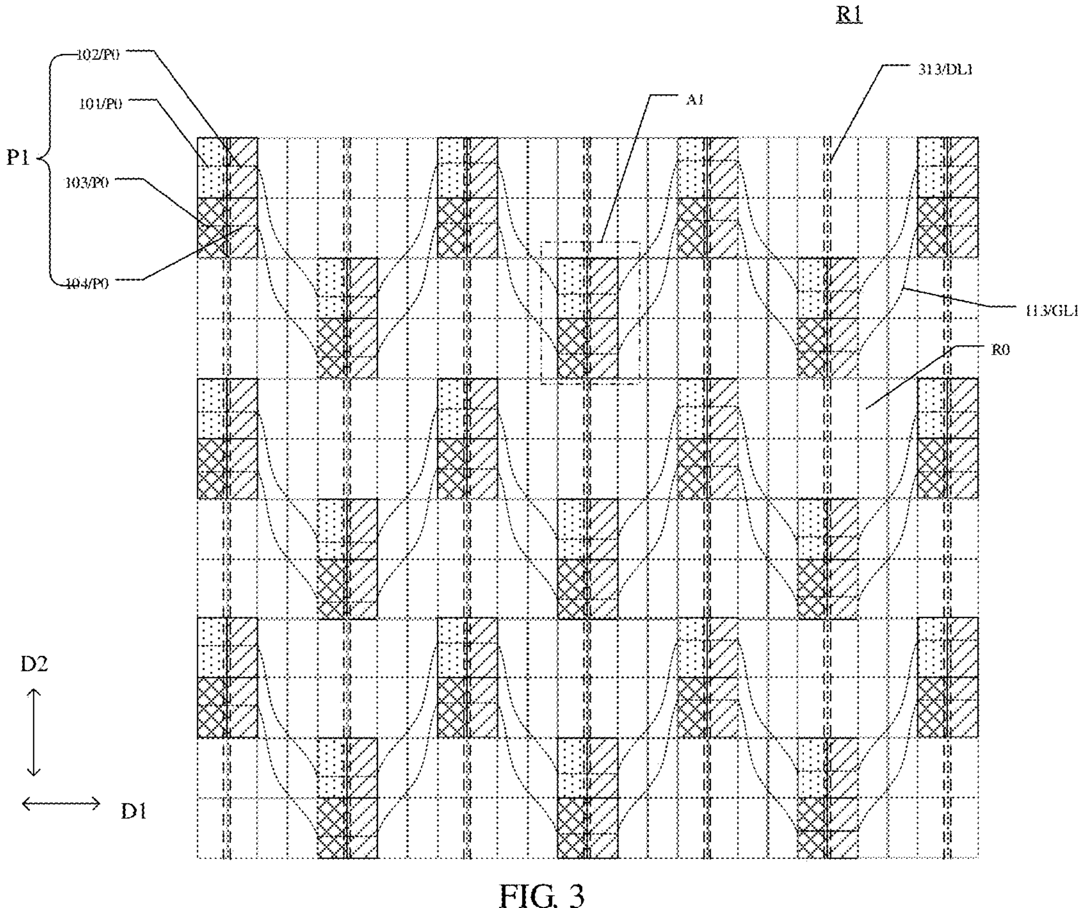
FIG. 3 is a schematic diagram of a first display region of a display panel provided by an embodiment of the present disclosure.

FIG. 2 is a schematic diagram of a second display region of a display panel provided by an embodiment of the present disclosure. FIG. 3 is a schematic diagram of a first display region of a display panel provided by an embodiment of the present disclosure. As illustrated in FIG. 2 and FIG. 3, the display panel includes a plurality of pixel units P0, and the plurality of pixel units P0 include a first pixel unit 101, a second pixel unit 102, a third pixel unit 103, and a fourth pixel unit 104. One first pixel unit 101, one second pixel unit 102, one third pixel unit 103, and one fourth pixel unit 104 constitute a pixel group P1. For example, one pixel group P1 includes two pixels; and in the pixel group P1, one first pixel unit 101 and one second pixel unit 102 constitute one pixel, and one third pixel unit 103 and one fourth pixel unit 104 constitute one pixel. One pixel group P1 forms two virtual pixels to improve the display effect. For example, one pixel group P1 is a repeating unit, and the repeating units are arranged in an array in the second display region R2. As illustrated in FIG. 3, in the first display region R1, one pixel group P1 is referred to as a pixel island A1. The first display region R1 includes a plurality of light transmission regions R0; the light transmission region R0 is located between adjacent pixel islands A1. The ambient light can pass through the light transmission region R0. For example, the light transmission region R0 may include a base substrate and a transparent insulation layer located on the base substrate, and the light transmission region R0 does not have a light shielding structure, for example, a metal trace. For example, the light transmission region R0 is located in a region defined by four adjacent pixel islands A1, but not limited thereto. For example, as illustrated in FIG. 3, adjacent pixel islands A1 are provided at intervals.

An embodiment of the present disclosure takes the first pixel unit 101 being a red pixel unit, the second pixel unit 102 being a green pixel unit, the third pixel unit 103 being a blue pixel unit, and the fourth pixel unit 104 being a green pixel unit as an example; and in other embodiments, the pixel group may also use pixel units of other colors. Of course, in other embodiments, an arrangement mode of a plurality of pixel units P0 in the display panel is not limited to those illustrated in FIG. 2 and FIG. 3.

Referring to FIG. 2 and FIG. 3, the plurality of pixel units P0 are located in the first display region R1 and the second display region R2, and the density of pixel units in the first display region R1 is lower than that of pixel units in the second display region R2. Or, the density of pixels in the first display region R1 is lower than that of pixels in the second display region R2. The density of the pixel units in the first display region R1 illustrated in FIG. 3 is one quarter of the density of the pixel units in the second display region R2. That is, the density of the pixels in the first display region R1 illustrated in FIG. 3 is one quarter of the density of the pixels in the second display region R2. An arrangement mode of the light transmission regions R0 and the pixel units in the first display region R1 is not limited to that illustrated in FIG. 3, and can be set as required. For example, in other embodiments, the density of the pixel units in the first display region R1 is one half, one third, one sixth, one eighth or the like of the density of the pixel units in the second display region R2 that is different from one quarter.

For example, as illustrated in FIG. 1A and FIG. 3, the display panel further includes gate lines 113 and data lines 313. The gate lines 113 and the data lines 313 are insulated from each other. Each gate line 113 is connected with a row of pixel units, and each data line 313 is connected with a column of pixel units. For example, the gate line 113 is configured to supply a scan signal to a row of pixel units.

For example, as illustrated in FIG. 1A and FIG. 3, the data lines 313 include a first data line DL1. The first data line DL1 is located at least in the first display region RE For example, the first data line DL1 extends from the first display region R1 to the second display region R2.

For example, as illustrated in FIG. 1A and FIG. 3, the gate lines include a first gate line GL1, and the first gate line GL1 extends from the second display region R2 to the first display region RE As illustrated in FIG. 3, the light transmission region R0 is defined by two adjacent first gate lines GL1 and two adjacent first data lines DL1, but not limited thereto.

Figure 4:
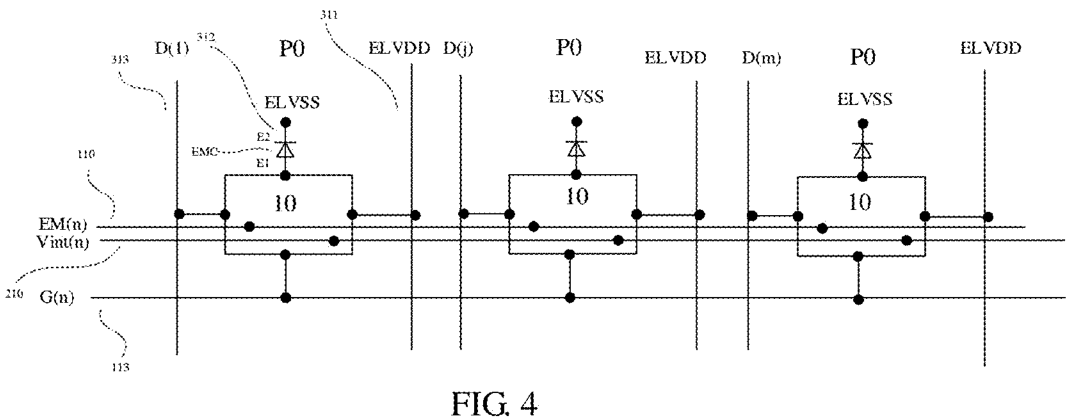
FIG. 4 is a schematic diagram of a pixel unit and a signal line for providing a signal to the pixel unit in a display panel provided by an embodiment of the present disclosure.

FIG. 4 is a schematic diagram of a pixel unit and a signal line for providing a signal to the pixel unit in a display panel provided by an embodiment of the present disclosure. As illustrated in FIG. 4, the display panel includes: a plurality of pixel units P0, each pixel unit P0 includes a light-emitting element EMC and a pixel circuit 10 for providing a driving current to the light-emitting element EMC, and the light-emitting element EMC can be an electroluminescent element, such as an organic electroluminescent element, which can be an Organic Light-Emitting Diode (OLED), for example.

As illustrated in FIG. 4, the display panel further includes an initialization signal line 210, a light-emitting control signal line 110, a data line 313, a first power supply line 311, and a second power supply line 312. For example, the gate line 113 is configured to supply a scan signal SCAN to the pixel circuit 10. The light-emitting control signal line 110 is configured to supply a light-emitting control signal EM to the pixel unit P0. The data line 313 is configured to supply a data signal DATA to the pixel circuit 10. The first power supply line 311 is configured to supply a constant first voltage signal ELVDD to the pixel circuit 10, the second power supply line 312 is configured to supply a constant second voltage signal ELVSS to the pixel circuit 10, and the first voltage signal ELVDD is greater than the second voltage signal ELVSS. The initialization signal line 210 is configured to supply an initialization signal Vint to the pixel circuit 10. The initialization signal Vint is a constant voltage signal, and its magnitude may be between the first voltage signal ELVDD and the second voltage signal ELVSS, for example, but not limited thereto. For example, the initialization signal Vint may be less than or equal to the second voltage signal ELVSS. For example, the pixel circuit 10 outputs a driving current to drive the light-emitting element EMC to emit light under the control of signals such as the scan signal SCAN, the data signal DATA, the initialization signal Vint, the first voltage signal ELVDD, the second voltage signal ELVSS, and the light-emitting control signal EM. As illustrated in FIG. 4, the light-emitting element EMC includes a pixel electrode E1 and a common electrode E2. The pixel electrode E1 is connected with the pixel circuit 10, and the common electrode E2 is connected with the second power supply line 312.

Figure 5:
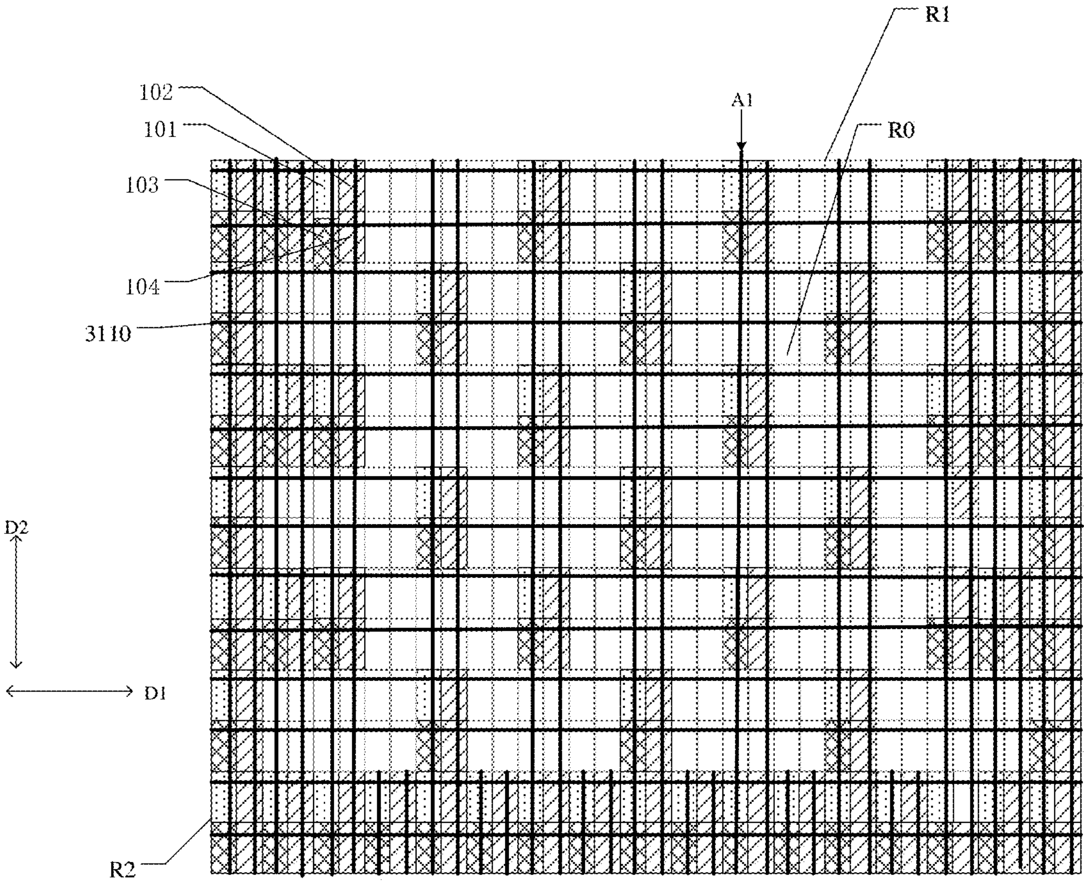
FIG. 5 is a schematic diagram of a display panel.

FIG. 5 is a schematic diagram of a display panel. As illustrated in FIG. 5, whether in the first display region R1 or in the second display region R2, the first power supply line 3110 is of a meshed structure, and horizontal parts of the first power supply line 3110 are directly connected, and vertical parts of the first power supply line 3110 are directly connected. However, a wiring mode of the first power supply line of the meshed structure makes the light transmittance of the first display region R1 relatively low.

FIG. 6A to FIG. 6E are schematic diagrams of display panels provided by some embodiments of the present disclosure. As illustrated in FIG. 6A to FIG. 6E, the first power supply line 311 includes a plurality of first conductive lines L1, a plurality of second conductive lines L2, and a plurality of third conductive lines L3, the first conductive line L1 extends from the second display region R2 to the first display region R1, the plurality of second conductive lines L2 are located in the first display region R1 and located between adjacent first conductive lines L1, each second conductive line L2 extends in a first direction D1, and the third conductive line L3 is located at least in the first display region R1, for example, the third conductive line L3 extends from the second display region R2 to the first display region R1, the third conductive line L3 extends in a second direction D2, the first direction D1 intersects with the second direction D2, and adjacent second conductive lines L2 are spaced apart from each other in the first direction D1, and the second conductive line L2 is connected with the first conductive line L1 by the third conductive line L3. For example, the first direction D1 is perpendicular to the second direction D2, but not limited thereto. For example, the first conductive line L1 extends in the first direction DE For example, in an embodiment of the present disclosure, the second conductive line L2 is only located in the first display region RE In an embodiment of the present disclosure, an element extending in a certain direction is not necessarily in a straight line, or may also have a curve or folded line part. For example, an extension direction of a certain element refers to a general extension trend of the element, for example, not every part of the element necessarily extends in this direction.

In the display panel provided by an embodiment of the present disclosure, adjusting a structure of the first power supply line in the first display region is equivalent to removing some of the first power supply lines provided in the second direction in the typical display panel, which simplifies the first power supply lines in the first display region and improves the light transmittance of the first display region.

For example, as illustrated in FIG. 6A to FIG. 6E, the first conductive line L1 and the second conductive line L2 are connected with two adjacent rows of pixel units in one pixel island A1, respectively, but not limited thereto; and in other embodiments, the pixel island A1 can further include more than two rows of pixel units. For example, as illustrated in FIG. 6A to FIG. 6E, the pixel island A1 at least includes two pixel units located in two adjacent rows, and the first conductive line L1 and the second conductive line L2 overlap with the two pixel units located in the two adjacent rows, respectively. For example, as illustrated in FIG. 6A to FIG. 6E, the first conductive line L1 overlaps with the first pixel unit 101, and the second conductive line L2 overlaps with the third pixel unit 103. For example, as illustrated in FIG. 6A to FIG. 6E, the first conductive line L1 further overlaps with the second pixel unit 102, and the second conductive line L2 further overlaps with the fourth pixel unit 104.

For example, as illustrated in FIG. 6A to FIG. 6E, a plurality of second conductive lines L2 are sequentially arranged in the first direction D1. For example, as illustrated in FIG. 6A to FIG. 6E, adjacent second conductive lines L2 are not directly connected, and a plurality of second conductive lines L2 that are not directly connected are formed by removing part of the first power supply lines provided in the first direction.

For example, as illustrated in FIG. 6A to FIG. 6E, in order to improve the light transmittance of the first display region, the length of the part of the first conductive line L1 located in the first display region R1 in the first direction D1 is greater than that of the second conductive line L2 in the first direction D1.

For example, as illustrated in FIG. 6A to FIG. 6E, the first power supply line 311 further includes a fourth conductive line L4, the fourth conductive line L4 extends in the second direction D2, and the second conductive line L2 is connected to the first conductive line L1 by the fourth conductive line L4, and the length of the fourth conductive line L4 in the second direction D2 is less than or equal to that of the third conductive line L3 in the second direction D2. In the display panel illustrated in FIG. 6A, FIG. 6B and FIG. 6E, the length of the fourth conductive line L4 in the second direction D2 is less than that of the third conductive line L3 in the second direction D2. In the display panel illustrated in FIG. 6C, the length of the fourth conductive line L4 in the second direction D2 is equal to that of the third conductive line L3 in the second direction D2.

Figure 6A:
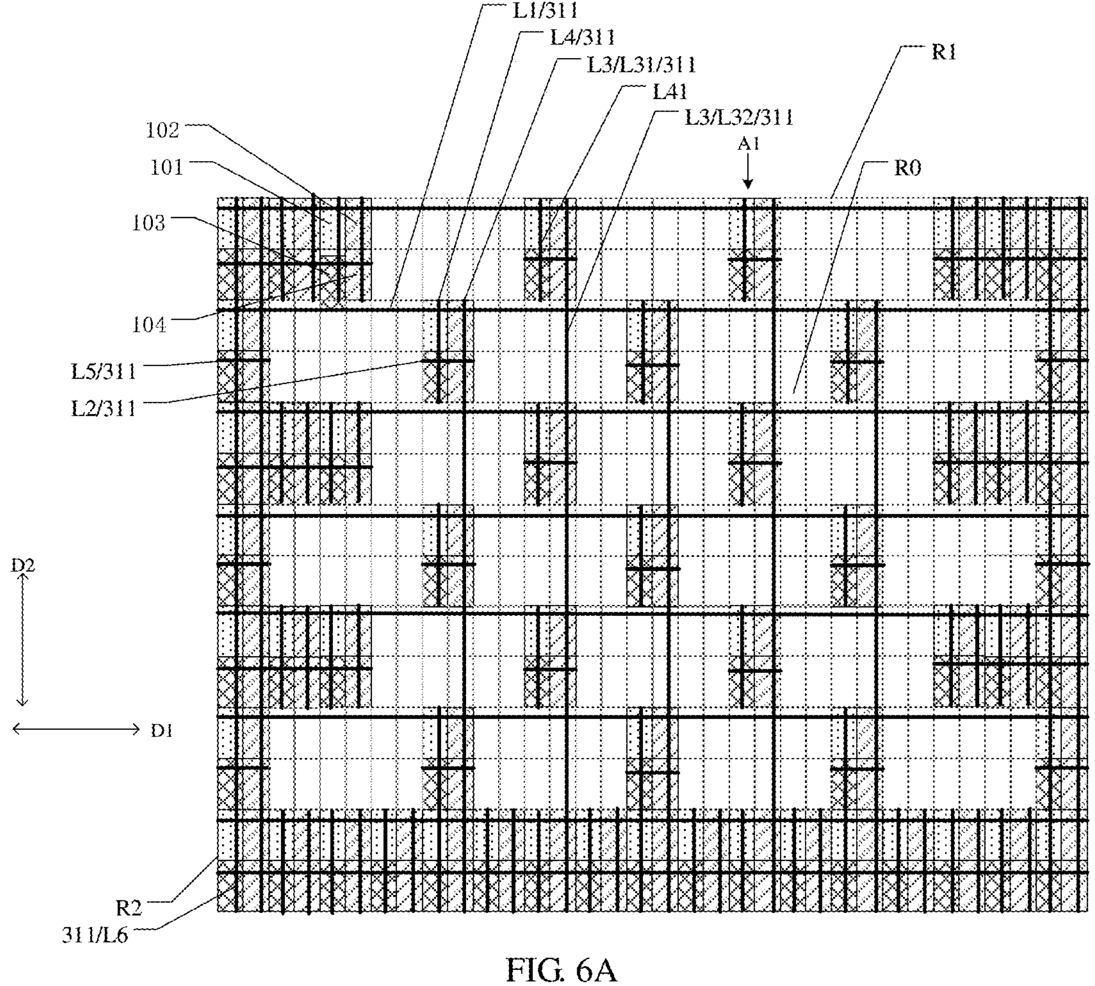
FIG. 6A to FIG. 6E are schematic diagrams of a display panel provided by some embodiments of the present disclosure.

For example, as illustrated in FIG. 6A to FIG. 6E, in order to further improve the light transmittance of the first display region, a plurality of fourth conductive lines L4 are provided, and are sequentially arranged in the second direction D2, and adjacent fourth conductive lines L4 are spaced apart from each other in the second direction D2. For example, as illustrated in FIG. 6A, the plurality of fourth conductive lines L41 are located between the third conductive line L31 and the third conductive line L32, and the third conductive line L31 and the third conductive line L32 are adjacent third conductive lines L3. FIG. 6A illustrates three fourth conductive lines L41, but the number of the fourth conductive lines L4 located between the adjacent third conductive lines L3 is not limited to that illustrated in the drawing, and can be determined as required. Because the plurality of fourth conductive lines L4 are spaced apart from each other in the second direction D2, it is equivalent to removing parts of the first power supply lines in the typical display panel provided in the second direction, thereby reducing wiring, optimizing a trace space, and improving the light transmittance.

For example, as illustrated in FIG. 6A to FIG. 6E, the first power supply line 311 further includes a fifth conductive line L5, the fifth conductive line L5 extends in the first direction D1, the fifth conductive line L5 is located in the second display region R2, and the fifth conductive line L5 is located between adjacent first conductive lines L1, the fifth conductive line L5 and the second conductive line L2 adjacent thereto are spaced apart from each other in the first direction DE Thus, at a junction position of the first display region and the second display region, wiring is reduced and the light transmittance is improved.

Figure 6B:
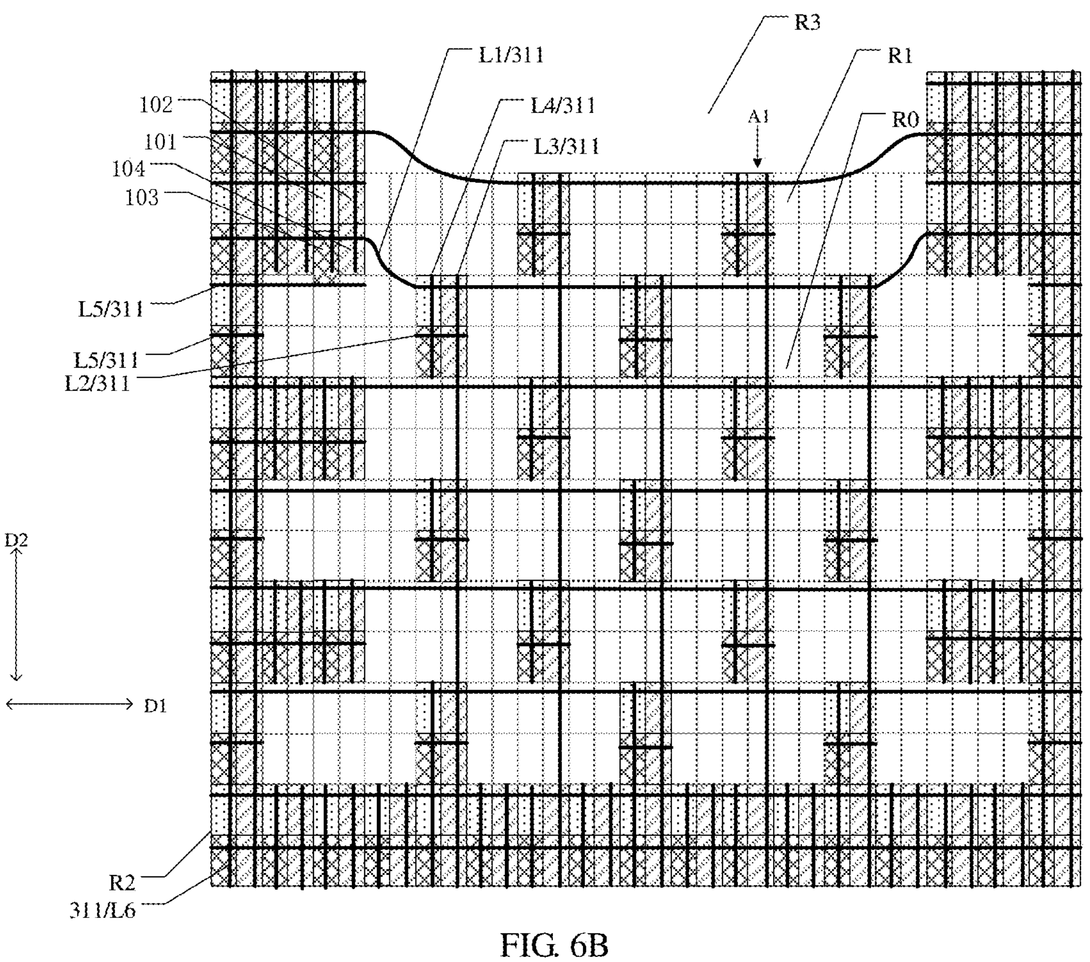
Figure 6C:
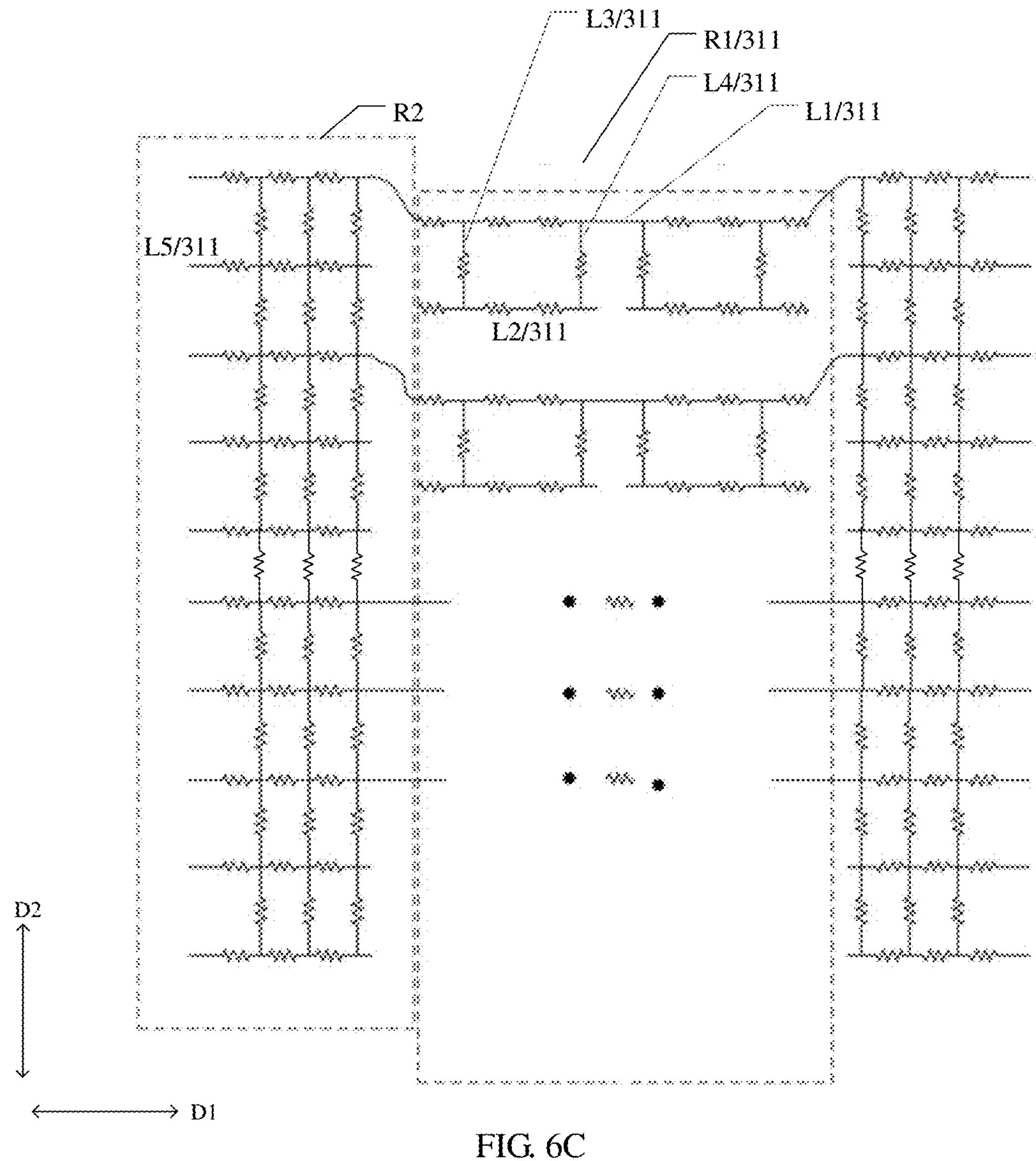
Figure 6D:
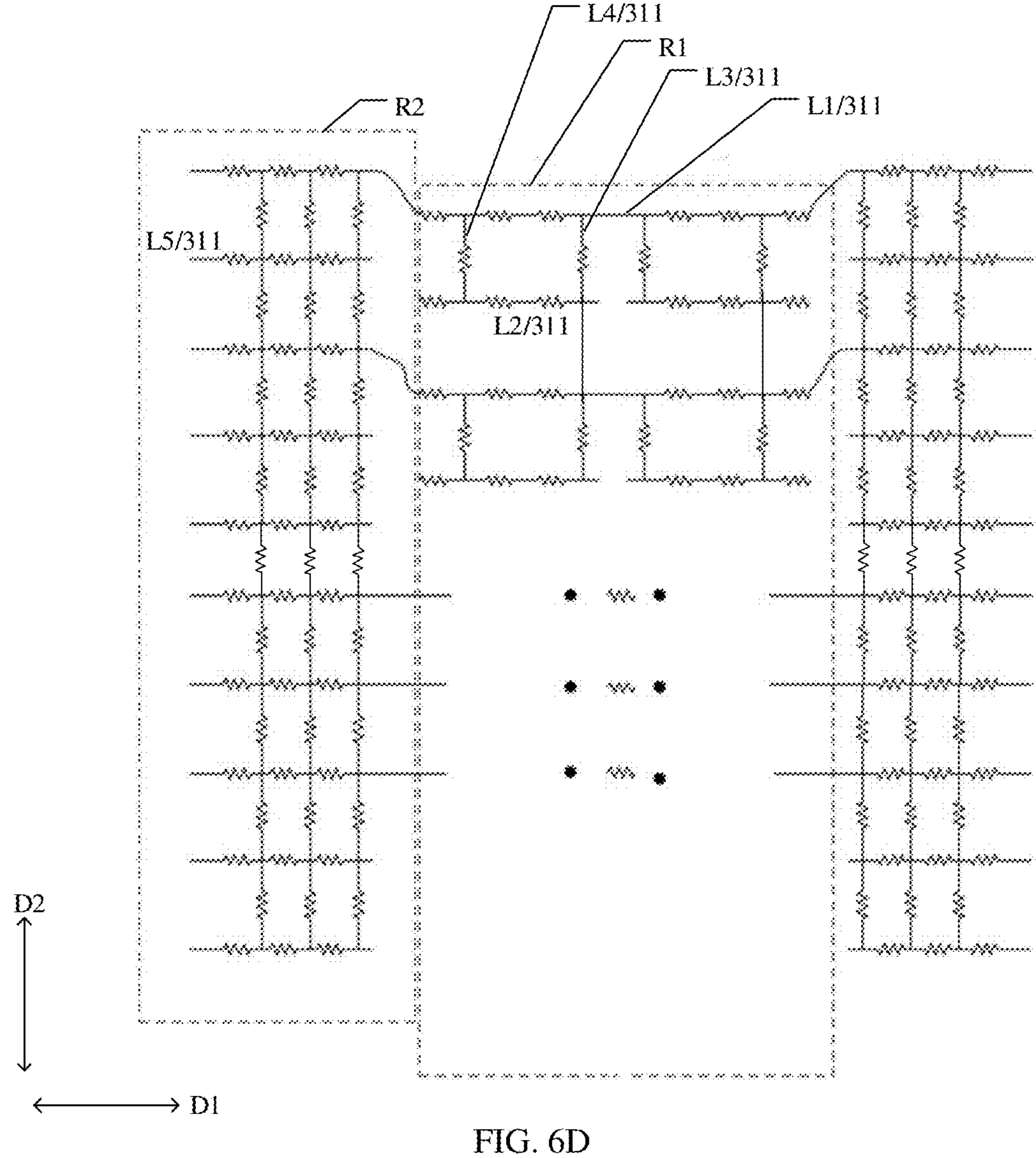
Figure 6E:
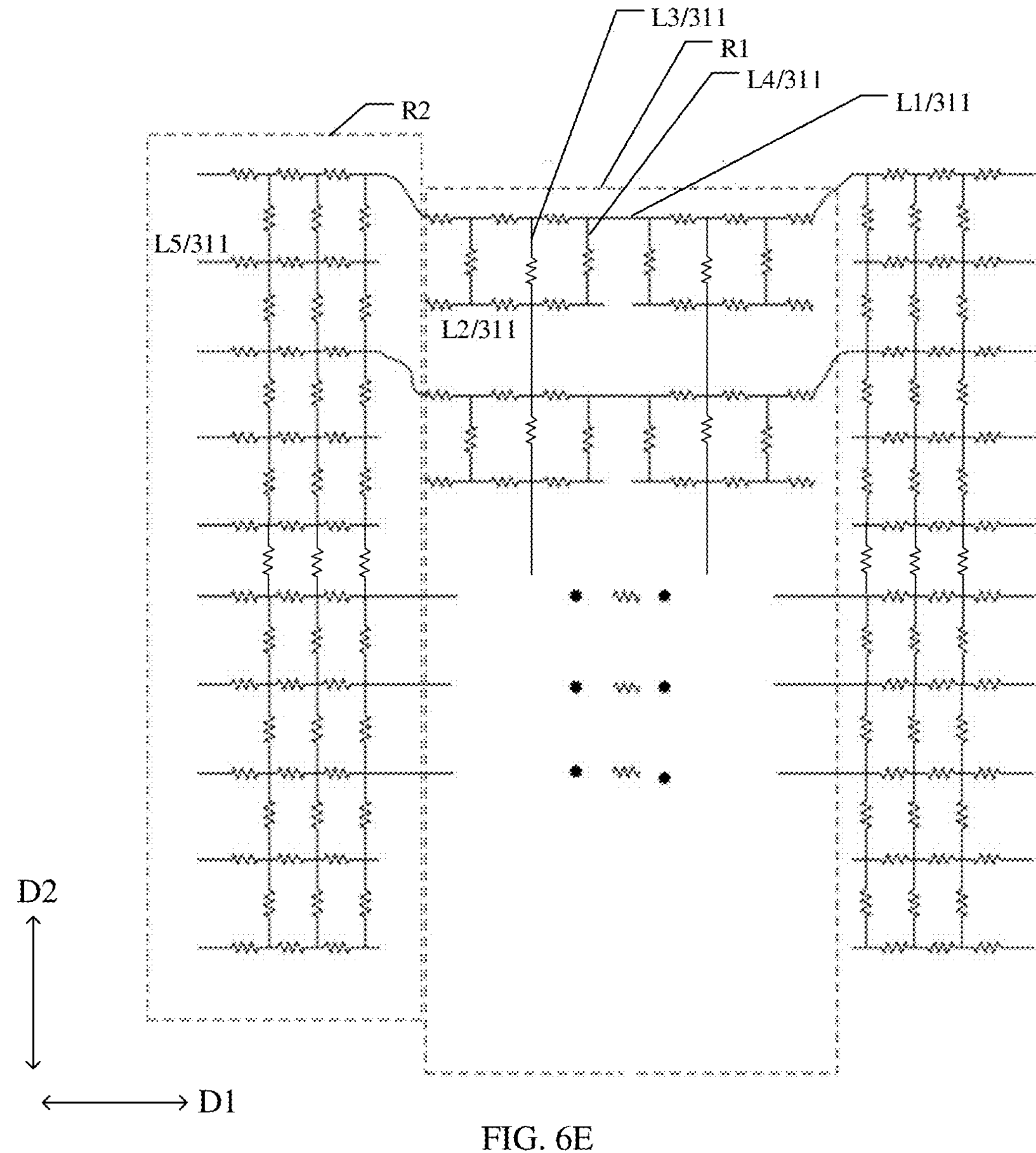

In the display panel illustrated in FIG. 6E, each pixel island includes two rows and three columns of pixel units. In an embodiment of the present disclosure, the number of the pixel units included in each pixel island and an arrangement mode of the pixel units are not limited, as long as the row number of the pixel units included in each pixel island is greater than or equal to two, the arrangement mode of the first power supply lines provided by the embodiment of the present disclosure can be used.

As illustrated in FIG. 6A and FIG. 6B, in the display panel, the first power supply line 311 further includes a plurality of sixth conductive lines L6, the sixth conductive lines L6 are located in the second display region R2, and the sixth conductive lines L6 extend in the second direction D2. In the second display region R2, the plurality of fifth conductive lines L5 and the plurality of sixth conductive lines L6 are provided in a crossed manner. In an embodiment of the present disclosure, the fifth conductive lines L5 and the sixth conductive lines L6 are all located only in the second display region R2.

Figure 7A:
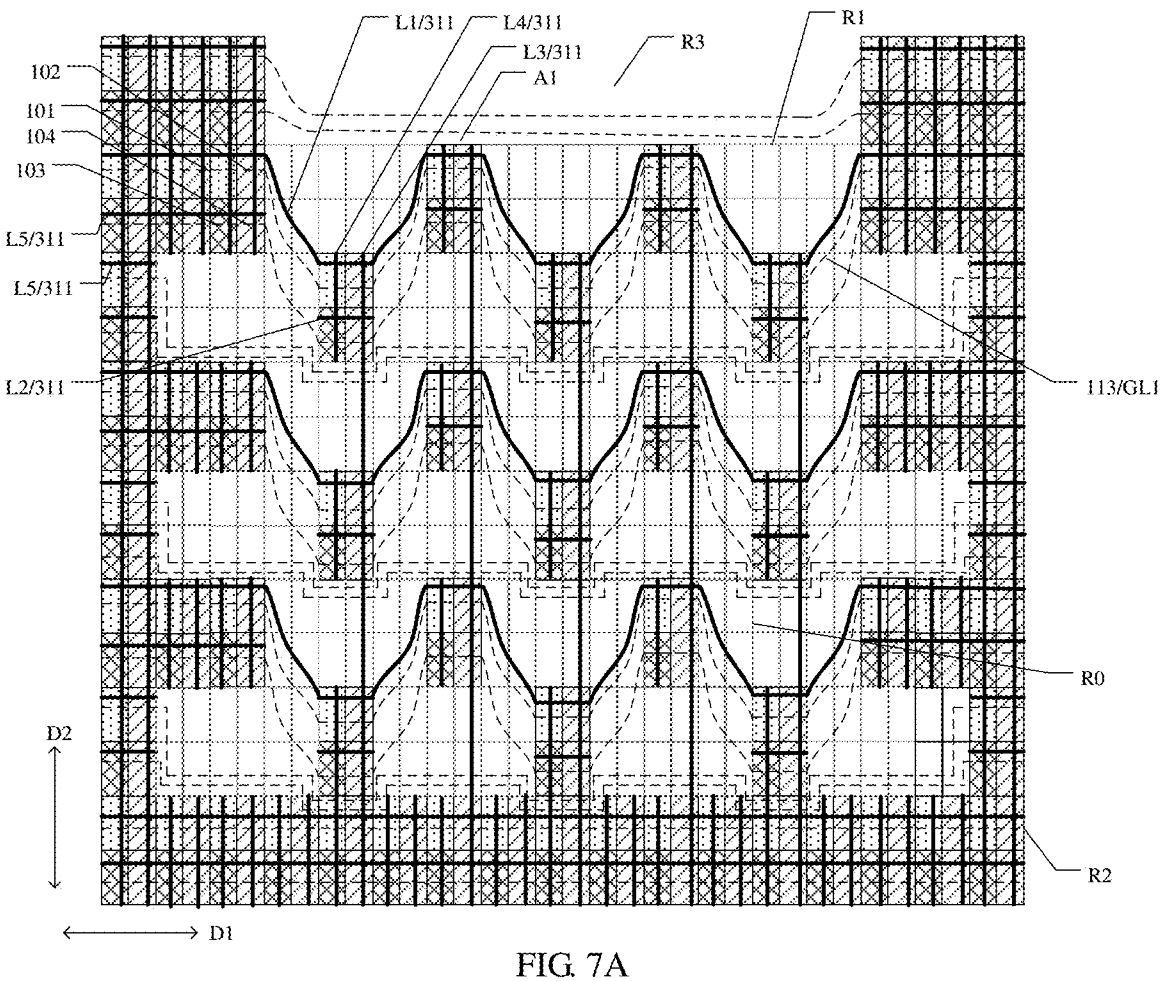
FIG. 7A is a schematic diagram of a display panel provided by an embodiment of the present disclosure.

FIG. 7A is a schematic diagram of a display panel provided by an embodiment of the present disclosure. As illustrated in FIG. 7A, the same gate line 113 connects pixel units in the second display regions located on both sides of the first display region R1 and pixel units located in the first display region R1 to constitute a row of pixel units. The embodiment of the present disclosure does not limit a shape of the first conductive line, as long as the first conductive line can extend from the second display region R2 to the first display region RE The first power supply line in FIG. 7A may also be replaced with a first power supply line in other embodiments of the present disclosure. Moreover, an extension mode of the gate line 113 is not limited to that illustrated in FIG. 7A, as long as an arrangement mode of the gate line 113 can make pixels in the second display region R2 and pixels in the first display region R1 connected.

Figure 7B:
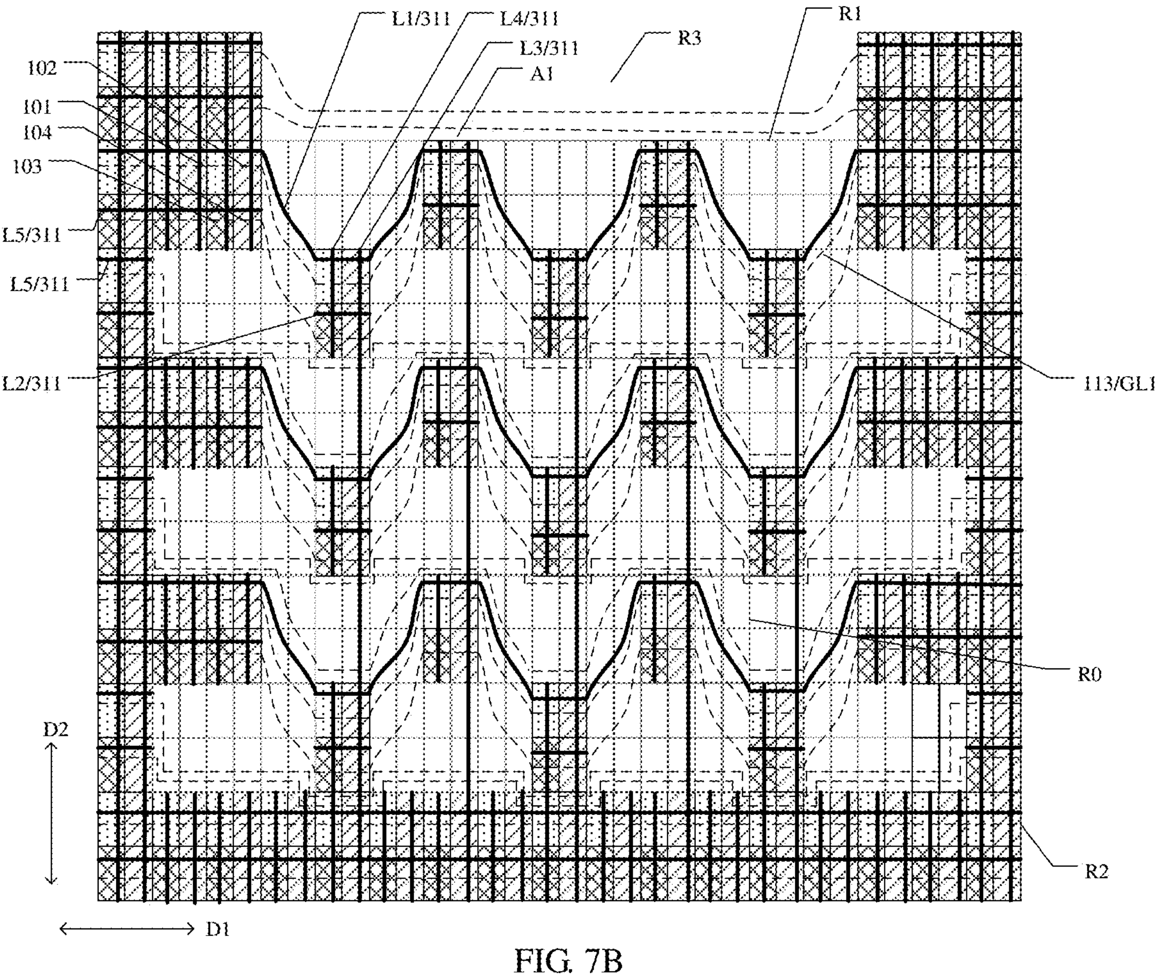
FIG. 7B is a schematic diagram of a display panel provided by an embodiment of the present disclosure.

FIG. 7B is a schematic diagram of a display panel provided by an embodiment of the present disclosure. Compared with the display panel illustrated in FIG. 7A, the display panel illustrated in FIG. 7B adjusts arrangement positions of some gate lines located in the first display region. That is, in the display panel illustrated in FIG. 7B, two gate lines are separately provided at an upper side and a lower side of the pixel island, respectively, while in the display panel illustrated in FIG. 7A, two gate lines are provided at a lower side of the pixel island.

FIG. 6A to FIGS. 6E, 7A and 7B are described with reference to the case where the second conductive line is connected with one of two adjacent first conductive lines but not directly connected with the other one of the two adjacent first conductive lines, by way of example. In the display panel illustrated in FIG. 6A to FIGS. 6E, 7A and 7B, the fourth conductive line is in contact with one of two adjacent first conductive lines, for example, through a via hole penetrating an insulation layer.

For example, in an embodiment of the present disclosure, a row of pixel units is pixel units connected to the same gate line 113, and a column of pixel units is pixel units connected to the same data line 313. In an embodiment of the present disclosure, it is illustrated with the first conductive line L1, the second conductive line L2, and the fifth conductive line L5 all extending in a row direction, and the third conductive line L3, the fourth conductive line L4, and the sixth conductive line L6 extending in a column direction as an example, but not limited thereto. In other embodiments, the first conductive line L1, the second conductive line L2, and the fifth conductive line L5 may all extend in the column direction, and the third conductive line L3, the fourth conductive line L4, and the sixth conductive line L6 may extend in the row direction, and correspondingly, the second direction D2 and the first direction D1 are also interchanged with each other.

FIG. 6A to FIG. 6E take the pixel island including two rows of pixel units as an example. In other embodiments, the pixel island may further include three or more rows of pixel units. In this case, the plurality of second conductive lines may be understood as second conductive lines connected with the same row of pixel units. In the case where the first conductive line L1, the second conductive line L2, and the fifth conductive line L5 all extend in the column direction, and the third conductive line L3, the fourth conductive line L4 and the sixth conductive line L6 extend in the row direction, the plurality of second conductive lines can be understood as the second conductive lines connected with the same column of pixel units.

Some embodiments of the present disclosure are described below in conjunction with FIG. 8 to FIG. 25. It is illustrated with a pixel circuit of 7T1C as an example in FIG. 8 to FIG. 24.

Figure 8:
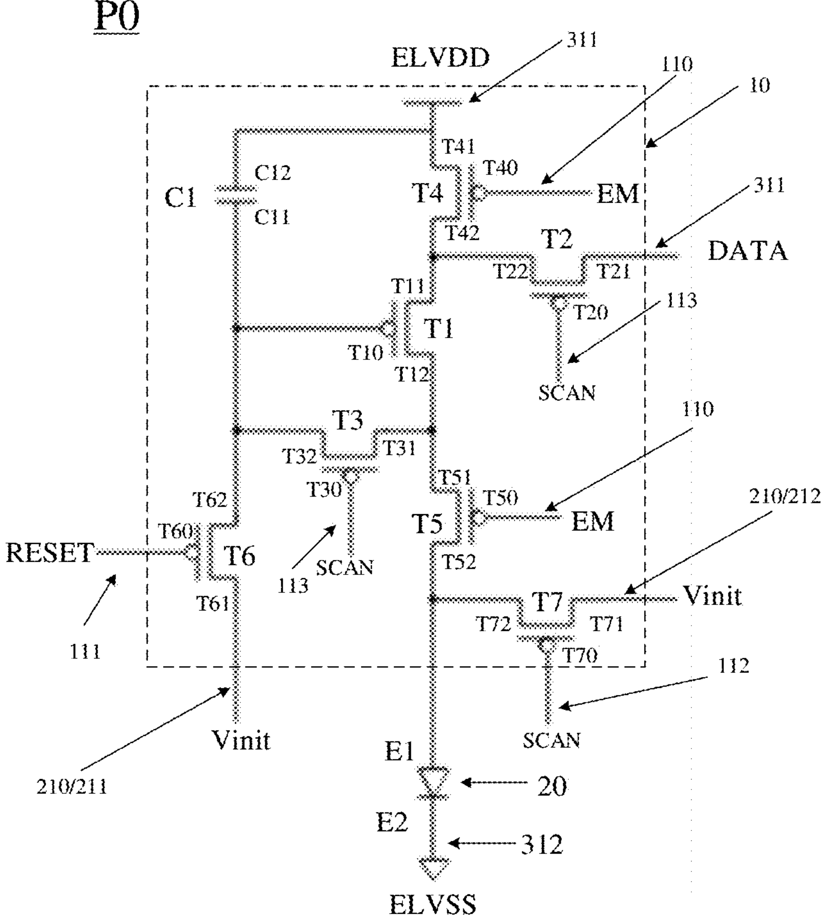
FIG. 8 is a principle diagram of a pixel circuit of a display panel provided by an embodiment of the present disclosure.
Figure 9:
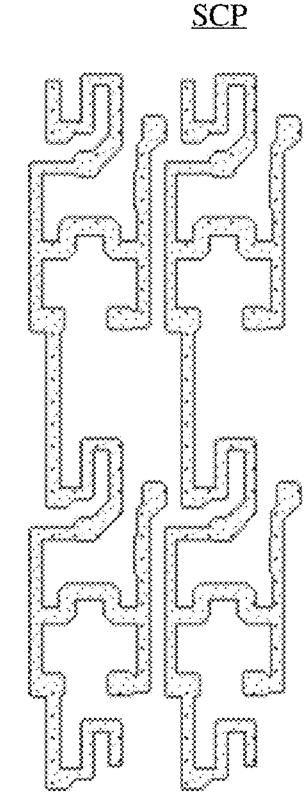
FIG. 9 is a plan view of a semiconductor pattern in a display panel provided by an embodiment of the present disclosure.
Figure 10:
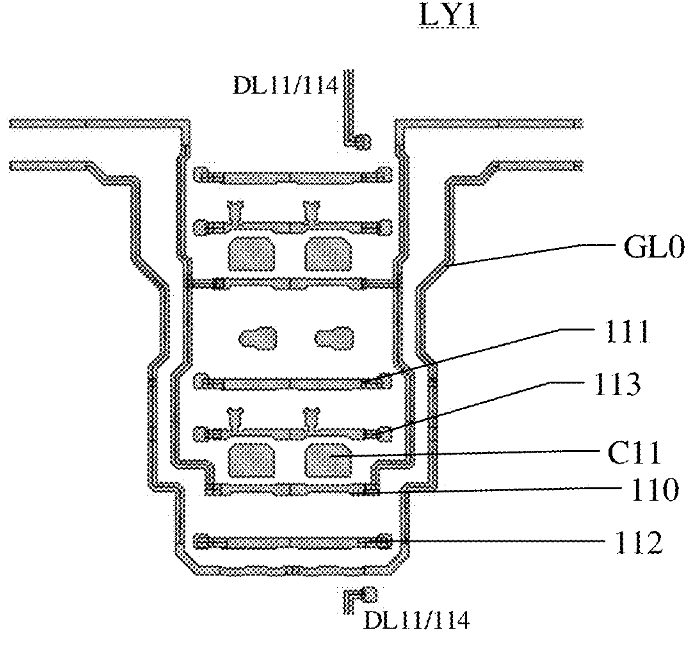
FIG. 10 is a plan view of a first conductive pattern layer in a display panel provided by an embodiment of the present disclosure.
Figure 11:
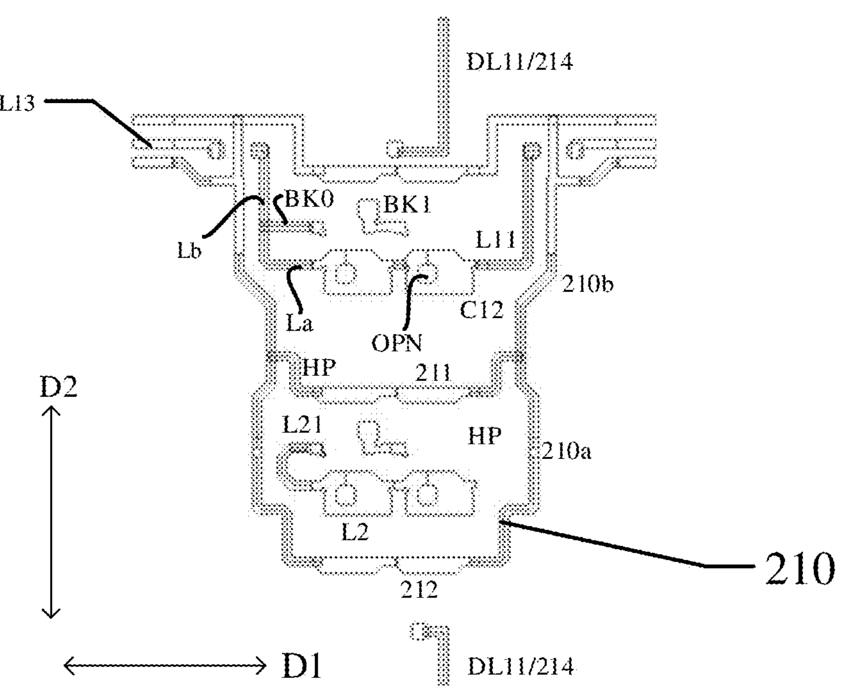
FIG. 11 is a plan view of a second conductive pattern layer in a display panel provided by an embodiment of the present disclosure.
Figure 12:
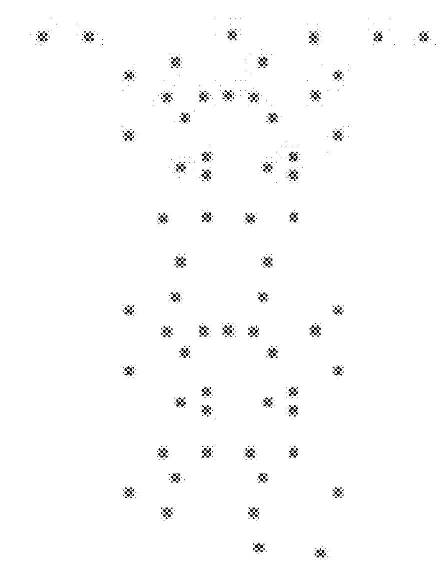
FIG. 12 is a plan view of a first insulation layer in a display panel provided by an embodiment of the present disclosure.
Figures 13, 14:
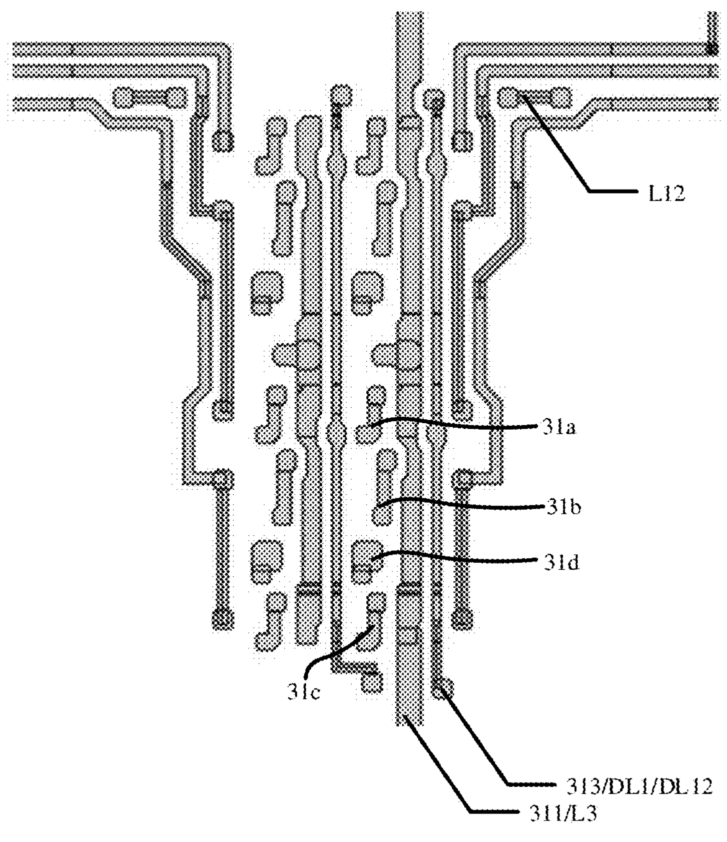
FIG. 13 is a plan view of a third conductive pattern layer in a display panel provided by an embodiment of the present disclosure.
FIG. 14 is a plan view of a second insulation layer in a display panel provided by an embodiment of the present disclosure.
Figure 15:
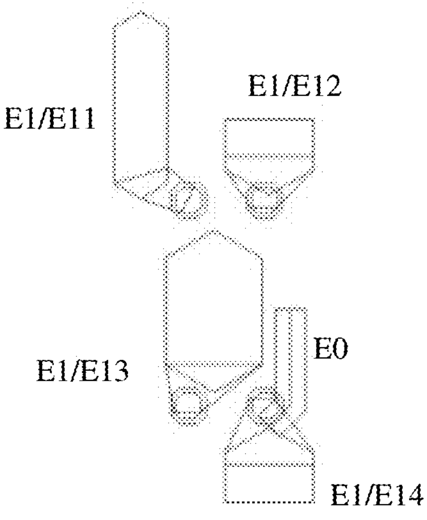
FIG. 15 is a plan view of a pixel electrode layer in a display panel provided by an embodiment of the present disclosure.
Figure 16:
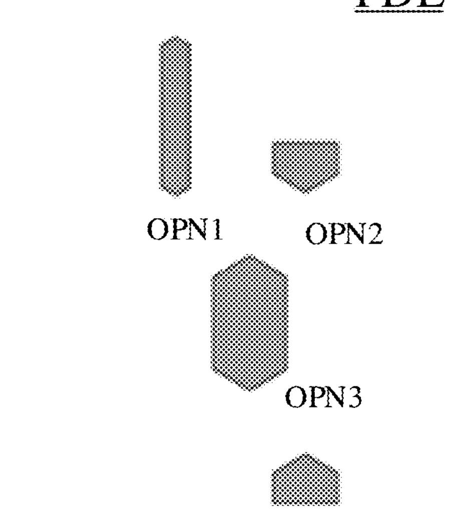
FIG. 16 is a plan view of a pixel definition layer in a display panel provided by an embodiment of the present disclosure.
Figure 17:
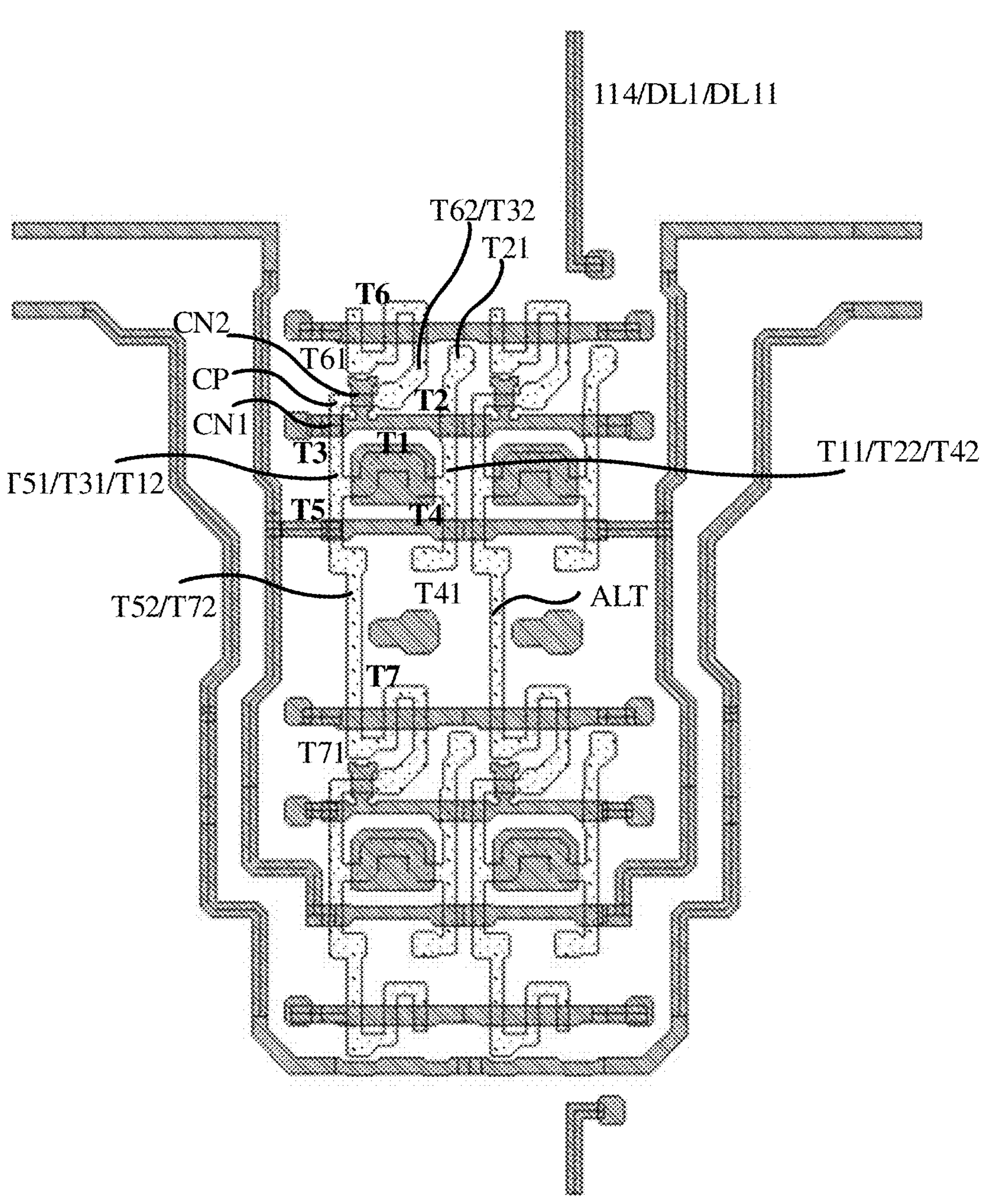
FIG. 17 is a schematic diagram of forming an active layer of a thin film transistor in a display panel provided by an embodiment of the present disclosure.
Figure 18:
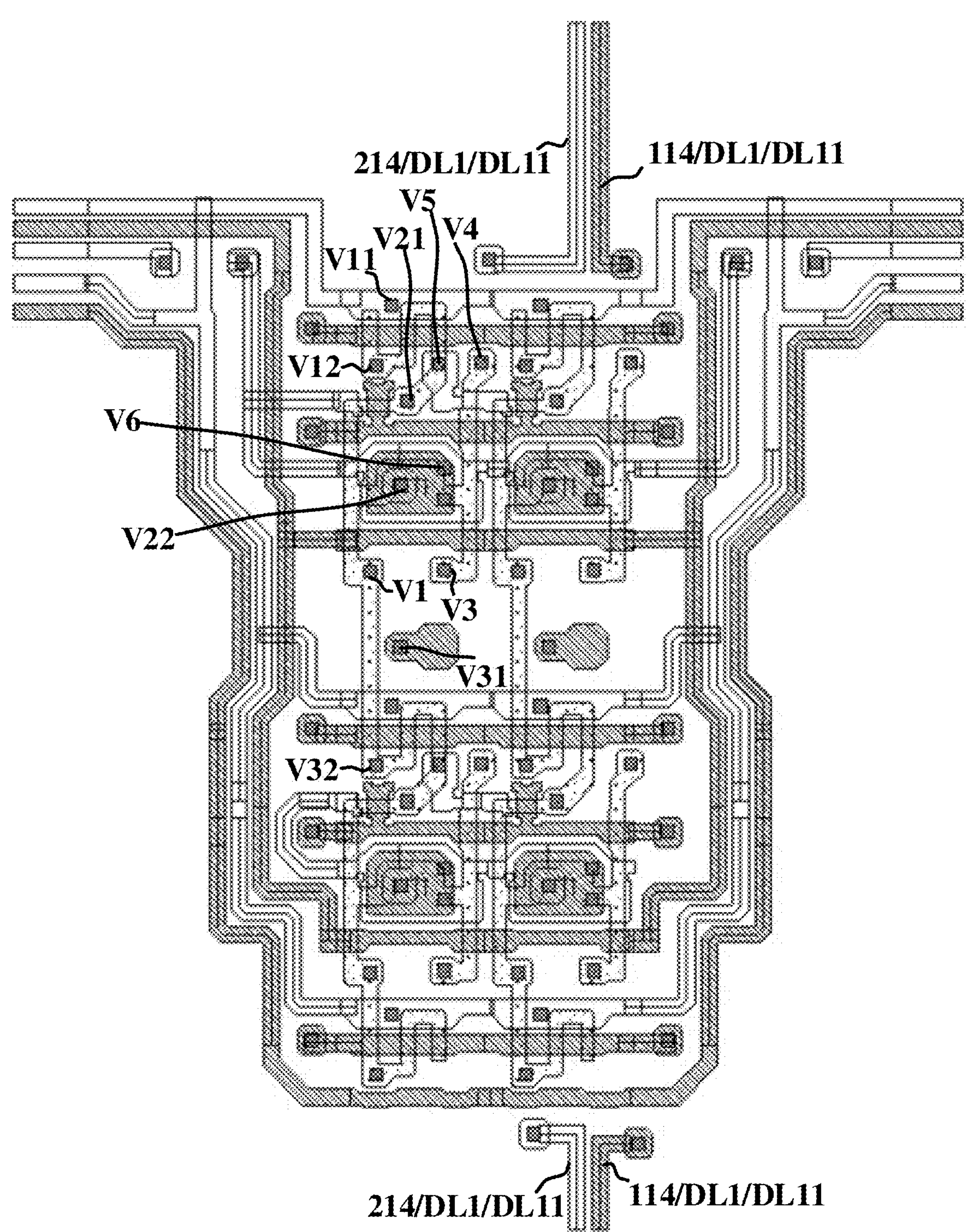
FIG. 18 is a schematic plan view after forming a second conductive pattern layer and a first insulation layer in a display panel provided by an embodiment of the present disclosure.
Figure 19:
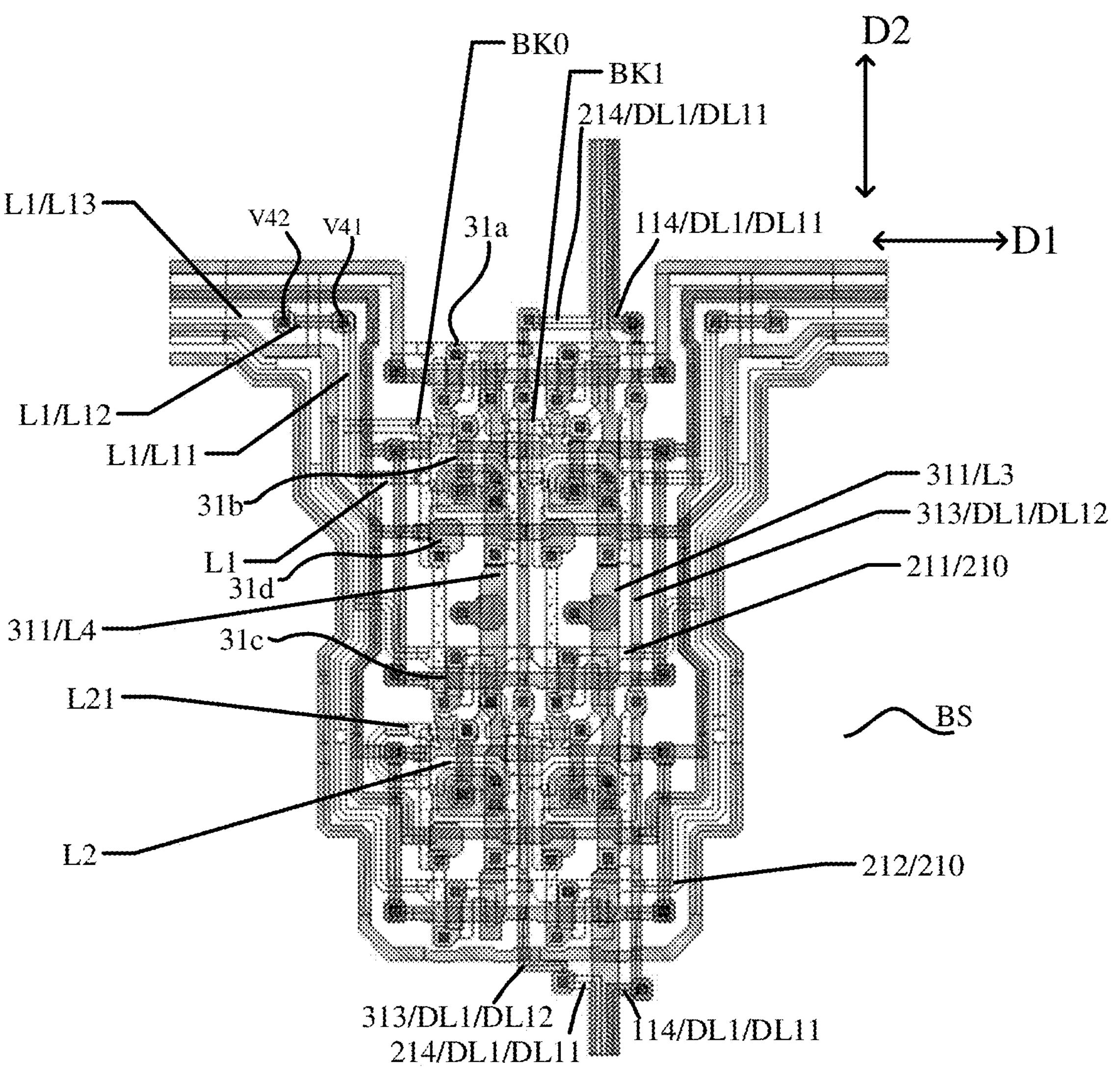
FIG. 19 is a schematic plan view after forming a third conductive pattern layer in a display panel provided an embodiment of the present disclosure.
Figure 20:
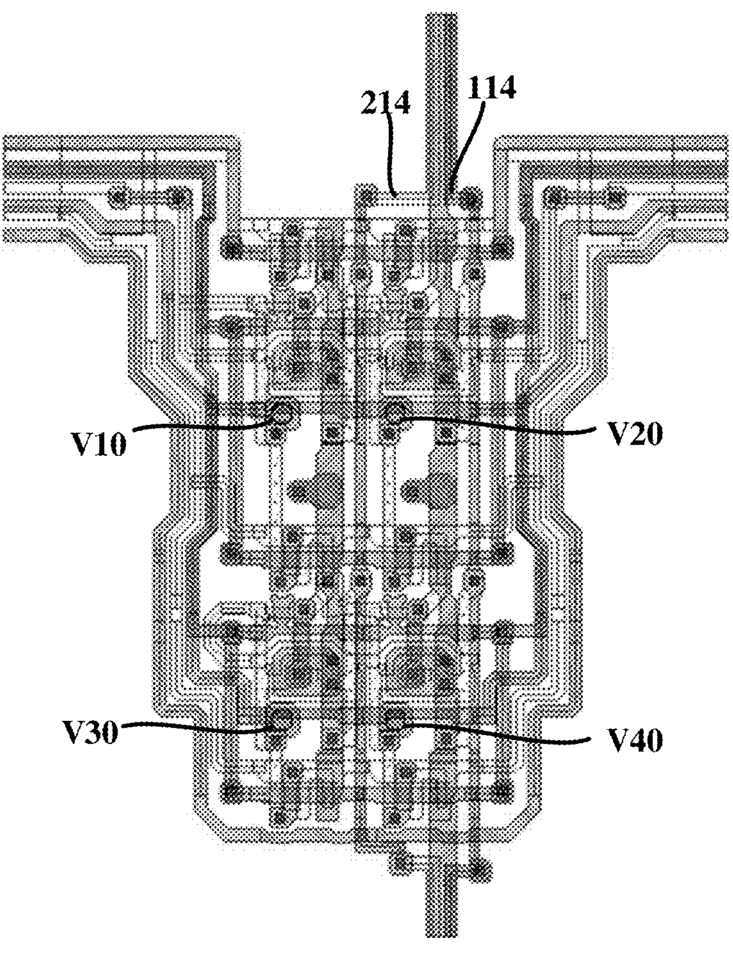
FIG. 20 is a schematic plan view after forming a second insulation layer in a display panel provided by an embodiment of the present disclosure.
Figure 21:
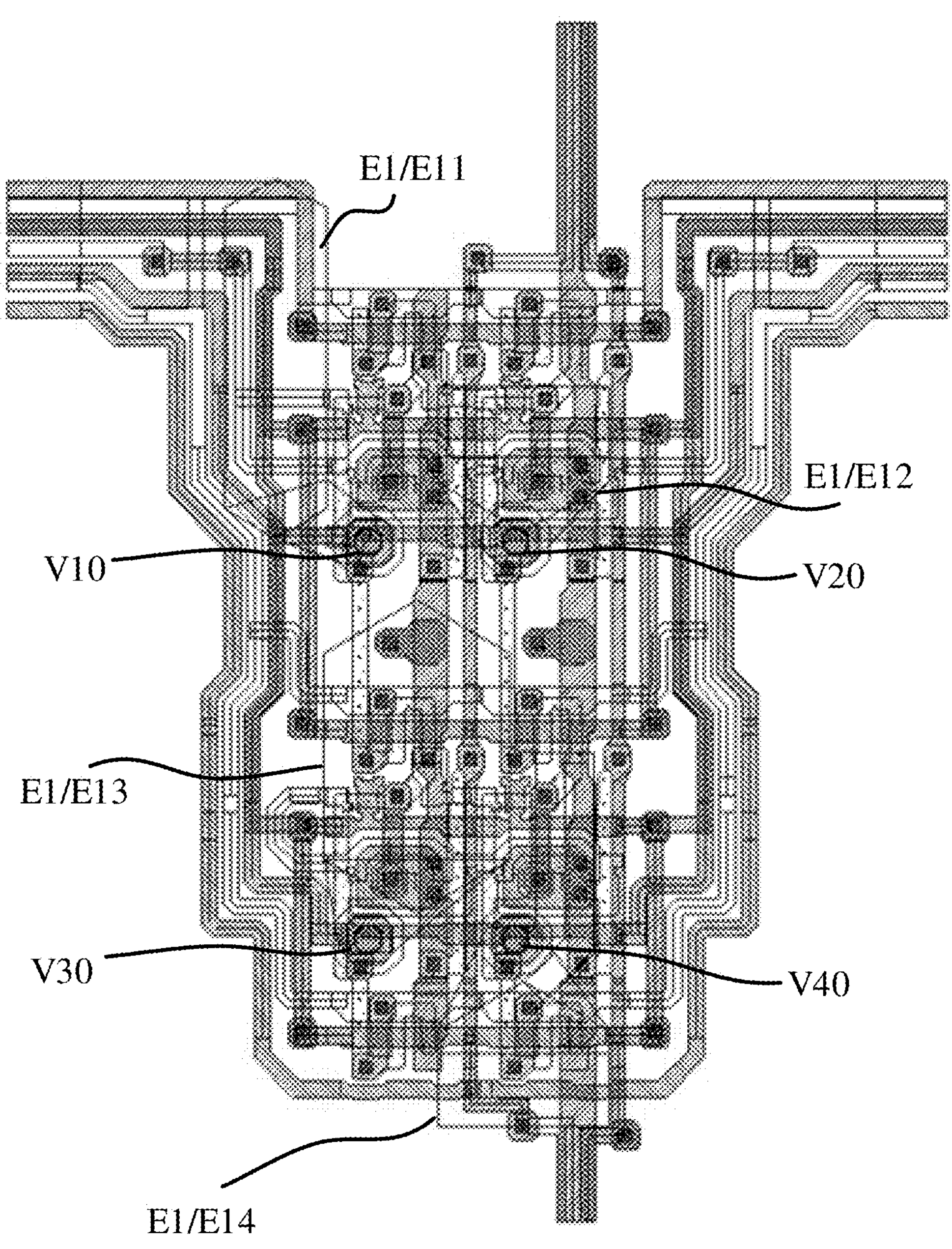
FIG. 21 is a schematic plan view after forming a pixel electrode layer in a display panel provided by an embodiment of the present disclosure.
Figure 22:
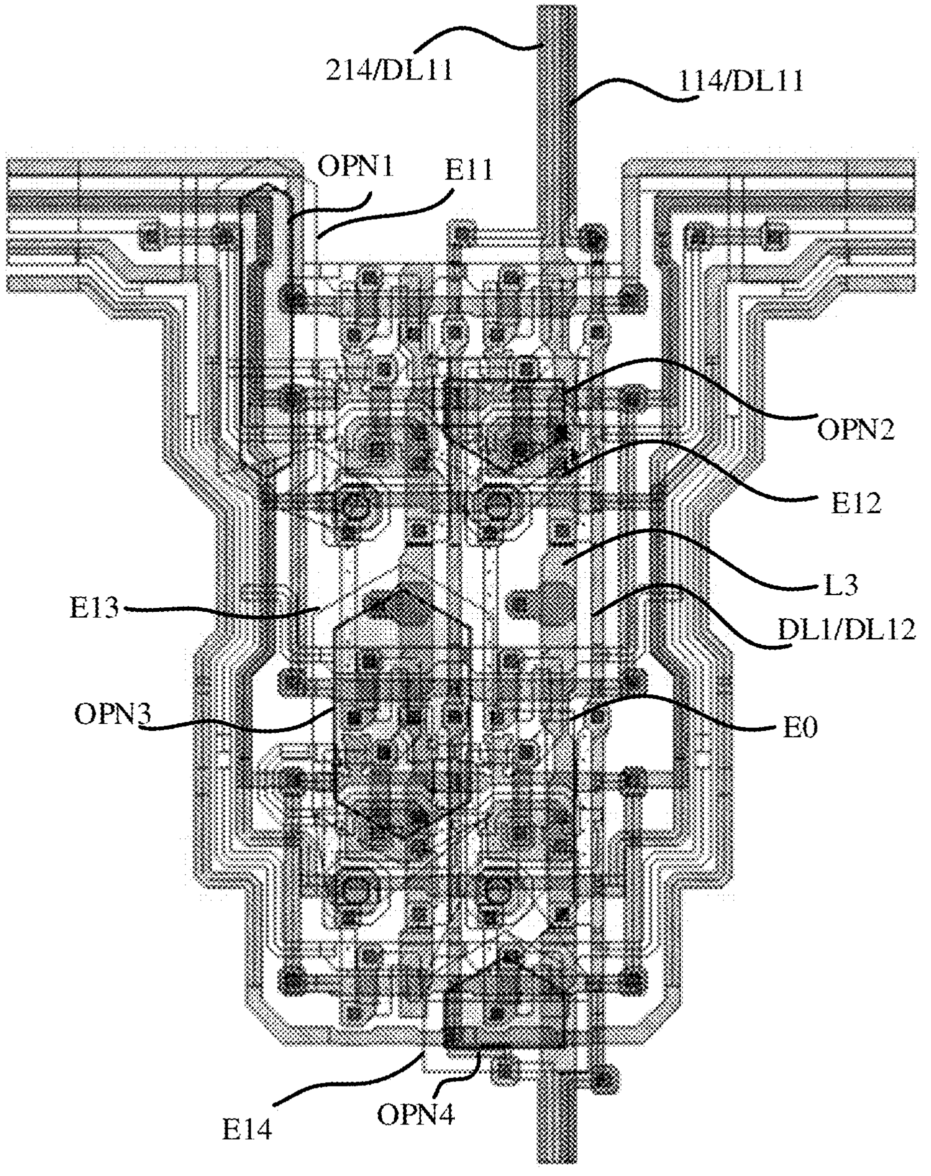
FIG. 22 is a schematic plan view after forming a pixel definition layer in a display panel provided by an embodiment of the present disclosure.
Figure 23:
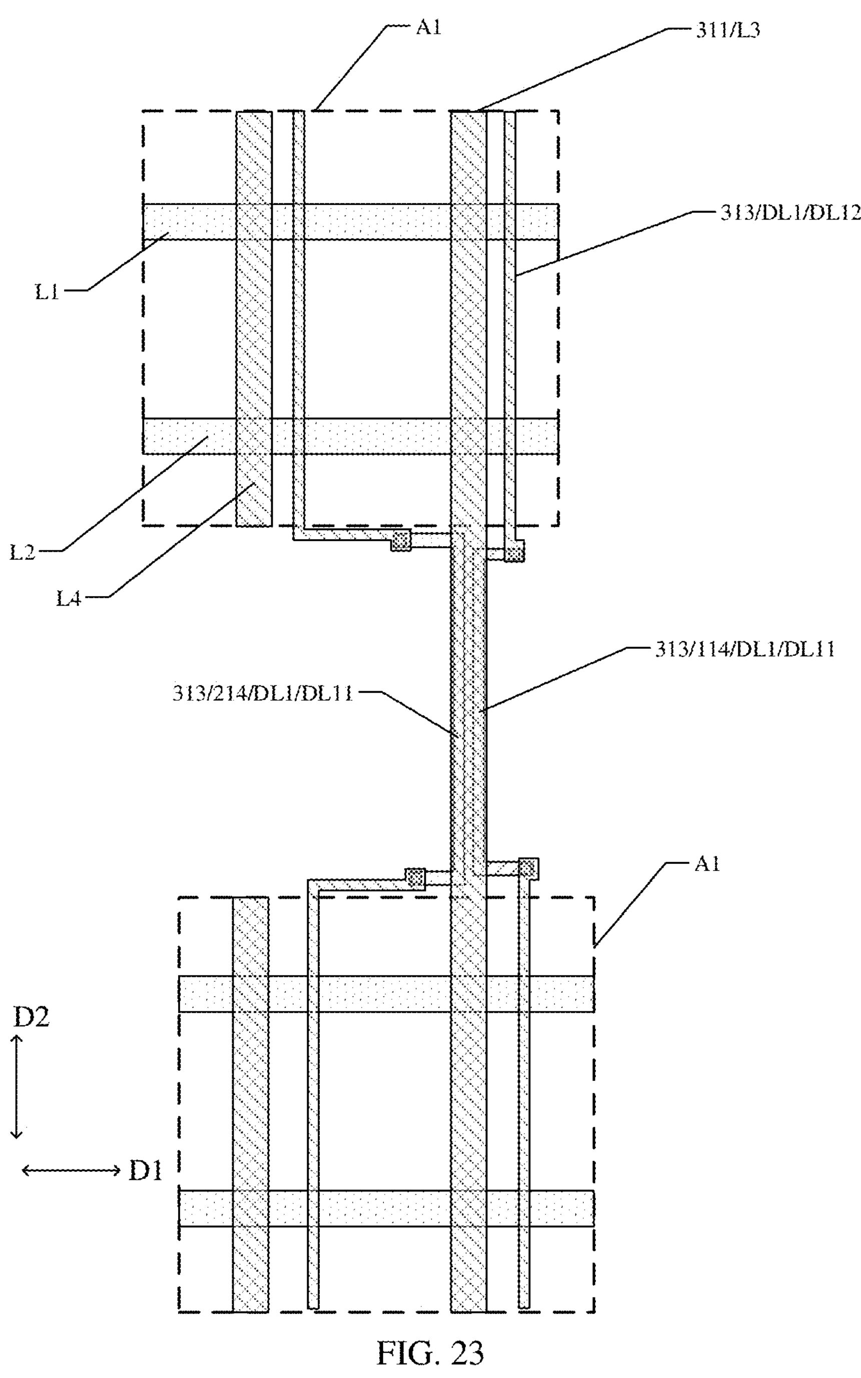
FIG. 23 is a schematic plan view of adjacent pixel islands in a second direction in a first display region in a display panel provided by an embodiment of the present disclosure.
Figure 24:
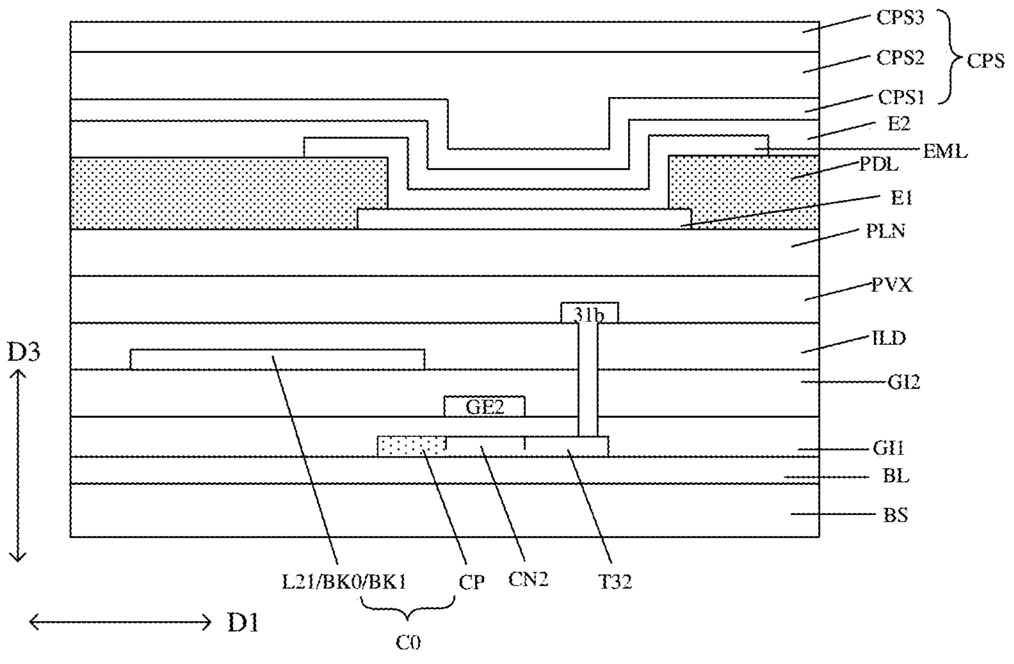
FIG. 24 is a schematic cross-sectional view of a display panel provided by an embodiment of the present disclosure.
Figure 25:
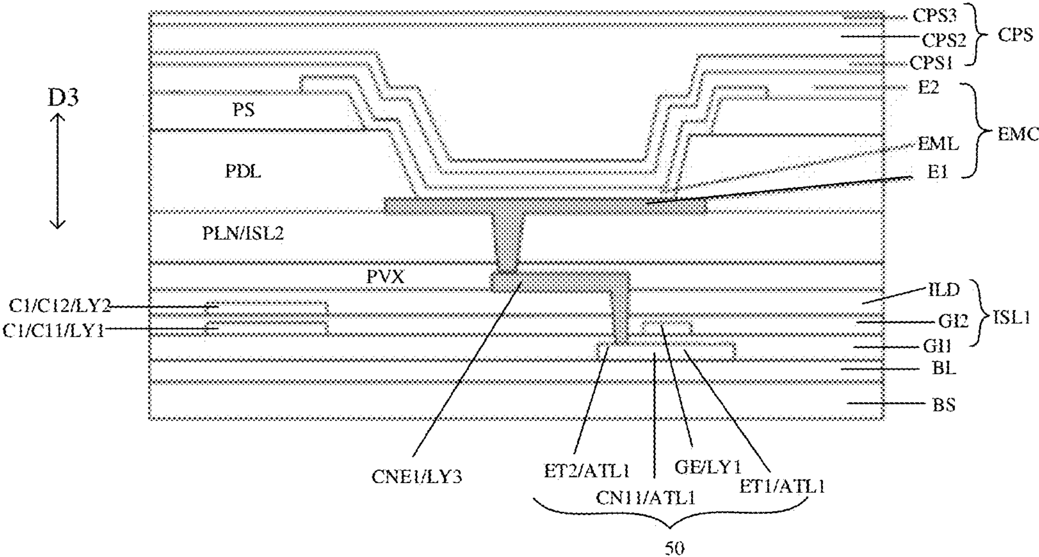
FIG. 25 is a schematic cross-sectional view of a display panel provided by an embodiment of the present disclosure.

FIG. 8 is a principle diagram of a pixel circuit of a display panel provided by an embodiment of the present disclosure. FIG. 9 is a plan view of a semiconductor pattern in a display panel provided by an embodiment of the present disclosure. FIG. 10 is a plan view of a first conductive pattern layer in a display panel provided by an embodiment of the present disclosure. FIG. 11 is a plan view of a second conductive pattern layer in a display panel provided by an embodiment of the present disclosure. FIG. 12 is a plan view of a first insulation layer in a display panel provided by an embodiment of the present disclosure. FIG. 13 is a plan view of a third conductive pattern layer in a display panel provided by an embodiment of the present disclosure. FIG. 14 is a plan view of a second insulation layer in a display panel provided by an embodiment of the present disclosure. FIG. 15 is a plan view of a pixel electrode layer in a display panel provided by an embodiment of the present disclosure. FIG. 16 is a plan view of a pixel definition layer in a display panel provided by an embodiment of the present disclosure. FIG. 17 is a schematic diagram of forming an active layer of a thin film transistor in a display panel provided by an embodiment of the present disclosure. FIG. 18 is a schematic plan view after forming a second conductive pattern layer and a first insulation layer in a display panel provided by an embodiment of the present disclosure. FIG. 19 is a schematic plan view after forming a third conductive pattern layer in a display panel provided an embodiment of the present disclosure. FIG. 20 is a schematic plan view after forming a second insulation layer in a display panel provided by an embodiment of the present disclosure. FIG. 21 is a schematic plan view after forming a pixel electrode layer in a display panel provided by an embodiment of the present disclosure. FIG. 22 is a schematic plan view after forming a pixel definition layer in a display panel provided by an embodiment of the present disclosure. FIG. 23 is a schematic plan view of adjacent pixel islands in a second direction in a first display region in a display panel provided by an embodiment of the present disclosure. FIG. 24 is a schematic cross-sectional view of a display panel provided by an embodiment of the present disclosure. FIG. 25 is a schematic cross-sectional view of a display panel provided by an embodiment of the present disclosure. In the embodiments of the present disclosure, for the sake of clarity of illustration, in a plan view, the insulation layer is illustrated in the form of via holes, and the insulation layer itself undergoes transparency treatment.

For example, referring to FIG. 8, the gate line 113 is configured to supply the scan signal SCAN to the pixel circuit 10. The light-emitting control signal line 110 is configured to supply the light-emitting control signal EM to the pixel unit P0. The data line 313 is configured to supply the data signal DATA to the pixel circuit 10. The first power supply line 311 is configured to supply the constant first voltage signal ELVDD to the pixel circuit 10, and the second power supply line 312 is configured to supply the constant second voltage signal ELVSS to the pixel circuit 10, and the first voltage signal ELVDD is greater than the second voltage signal ELVSS. The initialization signal line 210 is configured to supply the initialization signal Vint to the pixel circuit 10. The initialization signal Vint is a constant voltage signal, and its magnitude may be between the first voltage signal ELVDD and the second voltage signal ELVSS, but not limited thereto. For example, the initialization signal Vint may be less than or equal to the second voltage signal ELVSS. For example, the pixel circuit outputs a driving current to drive the light-emitting element 20 to emit light under the control of signals such as the scan signal SCAN, the data signal DATA, the initialization signal Vint, the first voltage signal ELVDD, the second voltage signal ELVSS, and the light-emitting control signal EM. The light-emitting element 20 emits red light, green light, blue light, white light or the like when driven by its corresponding pixel circuit 10.

As illustrated in FIG. 8, the pixel circuit 10 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The driving transistor T1 is electrically connected with the light-emitting element 20 and outputs a driving current to drive the light-emitting element 20 to emit light under the control of the signals such as the scan signal SCAN, the data signal DATA, the first voltage signal ELVDD, and the second voltage signal ELVSS.

For example, the display panel provided by an embodiment of the present disclosure further includes: a data driving circuit and a scan driving circuit. The data driving circuit is configured to supply a data signal DATA to the pixel unit P0 according to an instruction of a control circuit. The scan driving circuit is configured to supply signals such as a light-emitting control signal EM, a scan signal SCAN, and a reset control signal RESET to the pixel unit P0 according to the instruction of a control circuit. For example, the control circuit includes an external integrated circuit (IC), but not limited thereto. For example, the scan driving circuit is a Gate Driver On Array (GOA) structure that is mounted on the display panel, or a driver chip (IC) structure for bonding with the display panel. For example, the light-emitting control signal EM and the scan signal SCAN can also be provided by using different driving circuits, respectively. For example, the display panel further includes a power supply (not illustrated) to provide the voltage signals, which can be a voltage source or a current source as required, and the power supply is configured to supply the first voltage signal ELVDD, the second power supply voltage ELVSS, the initialization signal Vint and the like to the pixel unit P0 by the first power supply line 311, the second power supply line 312 and the initialization signal line 210, respectively.

As illustrated in FIG. 8, a second electrode C12 of the storage capacitor C1 is electrically connected with the first power supply line 311, and a first electrode C11 of the storage capacitor C1 is electrically connected with a second electrode T32 of the threshold compensation transistor T3. A gate electrode T20 of the data writing transistor T2 is electrically connected with the gate line 113, and a first electrode T21 and a second electrode T22 of the data writing transistor T2 are electrically connected with the data line 313 and a first electrode T11 of the driving transistor T1, respectively. A gate electrode T30 of the threshold compensation transistor T3 is electrically connected with the gate line 113, a first electrode T31 of the threshold compensation transistor T3 is electrically connected with a second electrode T12 of the driving transistor T1, and a second electrode T32 of the threshold compensation transistor T3 is electrically connected with a gate electrode T10 of the driving transistor T1.

For example, as illustrated in FIG. 8, a gate electrode T40 of the first light-emitting control transistor T4 and a gate electrode T50 of the second light-emitting control transistor T5 are both connected with the light-emitting control signal line 110.

For example, as illustrated in FIG. 8, a first electrode T41 and a second electrode T42 of the first light-emitting control transistor T4 are electrically connected with the first power supply line 311 and a first electrode T11 of the driving transistor T1, respectively. A first electrode T51 and a second electrode T52 of the second light-emitting control transistor T5 are electrically connected with a second electrode T12 of the driving transistor T1 and a pixel electrode E1 (which can be an anode of the OLED) of the light-emitting element 20, respectively. A common electrode E2 (which may be a common electrode of the OLED, such as a cathode) of the light-emitting element 20 is electrically connected with the second power supply line 312.

For example, as illustrated in FIG. 8, a gate electrode T60 of the first reset transistor T6 is electrically connected with the first reset control signal line 111, a first electrode T61 of the first reset transistor T6 is electrically connected with the initialization signal line 210 (a first initialization signal line 211), and a second electrode T62 of the first reset transistor T6 is electrically connected with a gate electrode T10 of the driving transistor T1. A gate electrode T70 of the second reset transistor T7 is electrically connected with the second reset control signal line 112, a first electrode T71 of the second reset transistor T7 is electrically connected with the initialization signal line 210 (a second initialization signal line 212), and a second electrode T72 of the second reset transistor T7 is electrically connected with the pixel electrode E1 of the light-emitting element 20.

FIG. 9 illustrates a semiconductor pattern SCP, and FIG. 10 illustrates a first conductive pattern layer LY1. A first gate insulation layer is provided between the first conductive pattern layer LY1 and the semiconductor pattern SCP. The semiconductor pattern SCP is doped by taking the first conductive pattern layer LY1 as a mask, such that a region of the semiconductor pattern SCP that is covered by the first conductive pattern layer LY1 retains semiconductor characteristics, forming a channel of the thin film transistor, while a region of the semiconductor pattern SCP that is not covered by the first conductive pattern layer LY1 is converted into a conductor, forming a source electrode or drain electrode of the thin film transistor. FIG. 17 illustrates an active layer ALT formed after the semiconductor pattern SCP is partially converted into a conductor.

As illustrated in FIG. 10, the first conductive pattern layer LY1 includes a first reset control signal line 111, a second reset control signal line 112, a light-emitting control signal line 110, a gate line 113, and a first electrode C11 of a storage capacitor C1. FIG. 10 further illustrates a first part DL11 (conductive line 114) of the first data line DLL FIG. 10 further illustrates a gate line GL0, the gate line GL0 is a part of the gate line that extends from the second display region to the first display region. For example, referring to FIG. 19, in an embodiment of the present disclosure, the first reset control signal line 111 and the second reset control signal line 112 are connected with each other.

FIG. 11 illustrates a second conductive pattern layer LY2, and a second gate insulation layer is provided between the second conductive pattern layer LY2 and the first conductive pattern layer LY1. The second conductive pattern layer LY2 includes a block BK0, a block BK1, an initialization signal line 210, and a second electrode C12 of the storage capacitor C1. The second electrode C12 of the storage capacitor C1 has an opening OPN. The initialization signal line 210 includes a first initialization signal line 211 and a second initialization signal line 212. As illustrated in FIG. 11, the second conductive pattern layer LY2 includes a first part L11 and a third part L13 of the first conductive line L1. As illustrated in FIG. 11, the block BK0 extends from the first conductive line L1. FIG. 12 illustrates a pattern of a first insulation layer ISL1, dots in the drawing are via holes in the first insulation layer ISL1, and the first insulation layer ISL1 includes at least one of a first gate insulation layer, a second gate insulation layer, and an interlayer insulation layer. The interlayer insulation layer is located between the second conductive pattern layer LY2 and the third conductive pattern layer LY3. Regarding the first gate insulation layer, the second gate insulation layer and the interlayer insulation layer, the first conductive pattern layer LY1, the second conductive pattern layer LY2, and the third conductive pattern layer LY3, reference may be made to FIG. 24 and FIG. 25. FIG. 18 illustrates a schematic plan view after forming the first insulation layer ISL1.

FIG. 13 illustrates the third conductive pattern layer LY3, and the third conductive pattern layer LY3 includes a third conductive line L3 (a part of the first power supply line 311), a second part DL12 of the data line (a part of the data line 313), a first connection electrode 31*a*, a second connection electrode 31*b*, a third connection electrode 31*c*, and a fourth connection electrode 31*d*. As illustrated in FIG. 13, the third conductive pattern layer LY3 further includes a second part L12 of the first conductive line L1. A first part L11 and a third part L13 of the first conductive line L1 are connected by the second part L12.

Referring to FIG. 13, FIG. 17, FIG. 18 and FIG. 19, the data line 313 is electrically connected with the first electrode T21 of the data writing transistor T2 through a via hole V4, the first power supply line 311 is electrically connected with the first electrode T41 of the first light-emitting control transistor T4 through a via hole V3, the first power supply line 311 is electrically connected with the second electrode C12 of the storage capacitor C1 through a via hole V6, and the first power supply line 311 is electrically connected with a block BK1 through a via hole V5. One end of the first connection electrode 31*a* is electrically connected with the first initialization signal line 211 through a via hole V11, and the other end of the first connection electrode 31*a* is electrically connected with the first electrode T61 of the first reset transistor T6 through a via hole V12, such that the first electrode T61 of the first reset transistor T6 is electrically connected with the first initialization signal line 211. One end of the second connection electrode 31*b* is electrically connected with the second electrode T62 of the first reset transistor T6 through a via hole V21, and the other end of the second connection electrode 31*b* is electrically connected with the gate electrode T10 (i.e. the first electrode C11 of the storage capacitor C1) of the driving transistor T1 through a via hole V22, such that the second electrode T62 of the first reset transistor T6 is electrically connected with the gate electrode T10 (that is, the first electrode C11 of the storage capacitor C1) of the driving transistor T1. One end of the third connection electrode 31*c* is electrically connected with the second initialization signal line 212 through a via hole V31, and the other end of the third connection electrode 31*c* is electrically connected with the first electrode T71 of the second reset transistor T7 through a via hole V32, such that the first electrode T71 of the second reset transistor T7 is electrically connected with the first initialization signal line 211. The fourth connection electrode 31*d* is electrically connected with the second electrode T52 of the second light-emitting control transistor T5 through a via hole V1. The fourth connection electrode 31*d* can be configured to be electrically connected with a pixel electrode E1 (referring to FIG. 8) of a subsequently formed light-emitting element 20.

FIG. 14 illustrates the second insulation layer ISL2, and dots in FIG. 14 are via holes V1 in the second insulation layer ISL2. As illustrated in FIG. 14, the via holes V1 include a via hole V10, a via hole V20, a via hole V30, and a via hole V40. FIG. 20 is a plan view after forming the second insulation layer.

FIG. 15 illustrates an electrode layer ETL. The electrode layer ETL includes a plurality of pixel electrodes E1. The electrode layer ETL includes a pixel electrode E11 of the first pixel unit 101, a pixel electrode E12 of the second pixel unit 102, a pixel electrode E13 of the third pixel unit 103, and a pixel electrode E14 of the fourth pixel unit 104. The pixel electrode E11 of the first pixel unit 101 is connected with the corresponding fourth connection electrode 31*d* through the via hole V10, the pixel electrode E12 of the second pixel unit 102 is connected with the corresponding fourth connection electrode 31*d* through the via hole V20, and the pixel electrode E13 of the third pixel unit 103 is connected with the corresponding fourth connection electrode 31*d* through the via hole V30, and the pixel electrode E14 of the fourth pixel unit 104 is connected with the corresponding fourth connection electrode 31*d* through the via hole V40. FIG. 21 is a plan view of a display panel after forming the electrode layer.

Referring to FIG. 15 and FIG. 22, the pixel electrode E14 of the fourth pixel unit 104 includes an extension portion E0, and an orthographic projection of the extension portion E0 on the base substrate can cover an orthographic projection of a shared electrode (the second electrode T22 of the data writing transistor T2 and the second electrode T42 of the first light-emitting control transistor T4) on the base substrate, to improve the stability and service life of the data writing transistor T2 and the first light-emitting control transistor T4, thereby improving the long-term light-emitting stability and service life of the display panel.

FIG. 16 illustrates a plan view of a pixel definition layer. As illustrated in FIG. 16, the pixel definition layer PDL includes a plurality of openings, and the plurality of openings include an opening OPN1, an opening OPN2, an opening OPN3, and an opening OPN4. FIG. 22 illustrates a schematic diagram of a display panel after forming a pixel definition layer. As illustrated in FIG. 22, the opening OPN1 exposes a part of the pixel electrode E11, the opening OPN 2 exposes a part of the pixel electrode E12, the opening OPN3 exposes a part of the pixel electrode E13, and the opening OPN4 exposes a part of the pixel electrode E14. In a subsequent process, a light-emitting functional layer and the common electrodes are formed, and then a light-emitting element EMC is formed.

It should be explained that, transistors used in the embodiment of the present disclosure may be thin film transistors, field effect transistors, or other switching components with the like characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode.

In addition, the transistors may be classified into N-type transistors and P-type transistors according to the characteristics of the transistors. The embodiments of the present disclosure illustrate the technical solution of the present disclosure in detail by taking the transistors as P-type transistors as an example. Based on the description and teaching of the implementations of the present disclosure, one of ordinary skill in the art can easily think of an implementation in which at least some of the transistors in the pixel circuit structure of the embodiment of the present disclosure adopt N-type transistors, that is, an implementation of using a transistor of N-type or a combination of a N-type transistor and a P-type transistor, without any inventive work, therefore, these implementations are also within the scope of the present disclosure.

It is illustrated with the pixel circuit of 7T1C as an example in FIG. 8 to FIG. 25, and the embodiments of the present disclosure include, but are not limited thereto. It should be noted that the embodiment of the present disclosure does not limit the number of the thin film transistors and the number of the capacitors included in the pixel circuit. For example, in some other embodiments, the pixel circuit of the display panel can also be of a structure including other numbers of transistors, such as a 7T2C structure, a 6T1C structure, a 6T2C structure, or a 9T2C structure, which is not limited by the embodiment of the present disclosure.

FIG. 25 is a schematic cross-sectional view of a display panel provided by an embodiment of the present disclosure. For example, as illustrated in FIG. 25, the display panel includes a thin film transistor 50 and a storage capacitor C1. The thin film transistor 50 includes an active layer ATL1 located on a base substrate BS, a first gate insulation layer GI1 located on the side of the active layer ATL1 away from the base substrate BS, and a gate electrode GE located on the side of the first gate insulation layer GI1 away from the base substrate BS. The display panel further includes a second gate insulation layer GI2 located on the side of the gate electrode GE away from the base substrate BS, an interlayer insulation layer ILD located on the side of the second gate insulation layer GI2 away from the base substrate BS, and a connection electrode CNE1 located on the side of the interlayer insulation layer ILD away from the base substrate BS. The active layer ATL1 includes a channel CN11 and a first electrode ET1 and a second electrode ET2 that are located on both sides of the channel CN11, respectively, and the connection electrode CNE1 is connected with the second electrode ET2 through a via hole that penetrates the first gate insulation layer GIL the second gate insulation layer GI2, and the interlayer insulation layer ILD. The storage capacitor C1 includes a first electrode C11 and a second electrode C12, the first electrode C11 and the gate electrode GE are located in the same layer, and are both located in the first conductive pattern layer LY1, and the second electrode C12 is located between the second gate insulation layer GI2 and the interlayer insulation layer ILD, and is located in the second conductive pattern layer LY2. One of the first electrode ET1 and the second electrode ET2 is a source electrode, and the other of the first electrode ET1 and the second electrode ET2 is a drain electrode. The connection electrode CNE1 is located on the third conductive pattern layer LY3. The display panel further includes a passivation layer PVX and a planarization layer PLN. For example, the connection electrode CNE1 may be the fourth connection electrode 31*d*, and the thin film transistor 50 may be the second light-emitting control transistor T5.

As illustrated in FIG. 25, the display panel further includes a light-emitting element EMC, the light-emitting element EMC includes a pixel electrode E1, a light-emitting functional layer EML, and a common electrode E2, and the pixel electrode E1 is connected with the connection electrode CNE1 through a via hole that penetrates the passivation layer PVX and the planarization layer PLN. The display panel further includes an encapsulation layer CPS, and the encapsulation layer CPS includes a first encapsulation layer CPS1, a second encapsulation layer CPS2, and a third encapsulation layer CPS3. For example, the first encapsulation layer CPS1 and the third encapsulation layer CPS3 are each an inorganic material layer, and the second encapsulation layer CPS2 is an organic material layer. For example, the pixel electrode E1 is an anode, and the common electrode E2 is a cathode, but not limited thereto.

For example, the light-emitting element EMC includes an organic light-emitting diode. The light-emitting functional layer is located between the common electrode E2 and the pixel electrode E1. The light-emitting functional layer EML includes at least a light-emitting layer, and may further include at least one of a hole transport layer, a hole injection layer, an electron transport layer, and an electron injection layer.

As illustrated in FIG. 25, the display panel further includes a pixel definition layer PDL and a spacer PS. The pixel definition layer PDL has an opening, the opening is configured to define a light-emitting area (a light exit region, an effective light-emitting area) of the pixel unit, and a spacer PS is configured to support a fine metal mask when forming the light-emitting functional layer EML. FIG. 25 illustrates that the spacers PS are provided on opposite sides of the light-emitting element, but is not limited thereto.

For example, the data line is configured to input a data signal to the pixel unit, and the first power supply signal line is configured to input a first power supply voltage to the driving transistor. The second power supply signal line is configured to input a second power supply voltage to the pixel unit. The first power supply voltage is a constant voltage, and the second power supply voltage is a constant voltage. For example, the first power supply voltage is a positive voltage, and the second power supply voltage is a negative voltage, but not limited thereto. For example, in some embodiments, the first power supply voltage is a positive voltage, and the second power supply signal line is grounded.

Referring to FIG. 25, in an embodiment of the present disclosure, the first insulation layer ISL1 includes at least one of a first gate insulation layer GI1, a second gate insulation layer GI2, and an interlayer insulation layer ILD, and the second insulation layer ISL2 includes a planarization layer PLN.

For example, the first gate insulation layer GI1, the second gate insulation layer GI2, the interlayer insulation layer ILD, the passivation layer PVX, the planarization layer PLN, the pixel definition layer PDL, and the spacer PS are all made of an insulation material. For example, the materials of the first gate insulation layer GIL the second gate insulation layer GI2, the interlayer insulation layer ILD, and the passivation layer PVX include at least one of SiOx and SiNx, but are not limited thereto. For example, the planarization layer PLN, the pixel definition layer PDL, and the spacer PS can be made of an organic insulation material, such as resin, but not limited thereto.

Referring to FIG. 17, the threshold compensation transistor T3 includes a first channel CN1 and a second channel CN2, and the first channel CN1 and the second channel CN2 are connected by a conductive portion CP. Referring to FIG. 19, the second conductive line L2 further includes a connection arm L21. The threshold compensation transistor T3 is a dual-gate transistor, and the conductive portion CP is in a floating state when the threshold compensation transistor T3 is turned off, and is easily affected by a jump of a voltage on a surrounding line. The voltage jump of the conductive portion CP will affect a leakage current of the threshold compensation transistor T3, which affects the luminous brightness of the pixel unit, and thus, it is necessary to keep the voltage of the conductive portion CP stable. A block can be designed to form a capacitor with the conductive portion CP, and the block can have a constant voltage signal, such that the voltage of the conductive portion CP in a floating state also remains stable. The block BK0, the block BK, and the connection arm L21 mentioned in the embodiments of the present disclosure all play a role in stabilizing the voltage of the conductive portion CP.

Referring to FIG. 24, the connection arm L21 partially overlaps with the conductive portion CP of the threshold compensation transistor T3 to form a capacitor C0, and the first gate insulation layer G11 and the second gate insulation layer GI2 are provided between the connection arm L21 and the conductive portion CP. FIG. 24 further illustrates the second channel CN2. The capacitor C0 may be referred to as a stabilization capacitor, and the connection arm L21 and the conductive portion CP are two electrode plates of the capacitor C0. As illustrated in FIG. 24, a gate electrode GE2 and the second channel CN2 overlap with each other in a direction perpendicular to the base substrate BS. The gate electrode GE2 is a gate electrode of the threshold compensation transistor T3. As illustrated in FIG. 24, the second connection electrode 31*b* is connected with the second electrode T32 of the threshold compensation transistor T3.

Referring to FIG. 19, the second conductive line L2 further includes a connection arm L21, and the connection arm L21 and the conductive portion CP are spaced apart from each other in a third direction D3 and partially overlap with each other in the third direction D3 (referring to FIG. 24). For example, a shape of the connection arm L21 includes a C shape. It should be noted that the connection arm L21 may be generally C-shaped. Of course, the connecting arm L21 may also be in other shapes, as long as it can play a role of stabilizing the threshold compensation transistor T3.

For example, the third direction D3 is perpendicular to the first direction D1 and is perpendicular to the second direction D2, the third direction D3 is a direction perpendicular to the base substrate BS, and the first gate insulation layer G11 and the second gate insulation layer GI2 are provided between the connection arm L21 and the conductive portion CP. For example, each of the first direction D1 and the second direction D2 is a direction parallel with a main surface of the base substrate BS, and the third direction D3 is a direction perpendicular to the main surface of the base substrate BS. Various elements are formed on the main surface of the base substrate BS.

Referring to FIG. 11, FIG. 19 and FIG. 24, the first part L11 includes a first sub-portion La extending in the first direction D1 and a second sub-portion Lb extending in the second direction, the second sub-portion Lb has a branch, the branch extends in the first direction D1, and the block BK0 is the branch of the second sub-portion Lb. Referring to FIG. 17, FIG. 19 and FIG. 24, the branch (the block BK0) of the second sub-portion Lb and the conductive portion of one pixel unit in the pixel island that overlaps with the first conductive line L1 are spaced apart from each other in the third direction D3, and partially overlap with each other in the third direction D3. Referring to FIG. 17, FIG. 19 and FIG. 24, the branch (the block BK0) of the second sub-portion Lb and the conductive portion CP of one pixel unit (the pixel unit at an upper left corner of FIG. 24) in the pixel island that overlaps with the first conductive line L1 are spaced apart from each other in the third direction D3, and partially overlap with each other in the third direction D3. For example, the length of the branch (the block BK0) in the first direction D1 is less than that of the first sub-portion La in the first direction D1.

For example, referring to FIG. 8, FIG. 17, FIG. 19 and FIG. 24, the pixel circuit 10 includes a first transistor and a second transistor, the first transistor is connected with the second transistor, the second transistor is connected with the light-emitting element, the first transistor includes a first channel CN1 and a second channel CN2, the first channel CN1 and the second channel CN2 are connected by the conductive portion CP, and the second conductive line L2 further includes a connection arm L21, and the connection arm L21 and the conductive portion CP of one pixel unit in the pixel island that overlaps with the second conductive line L2 (the pixel unit located at a lower left corner in FIG. 19) are spaced apart from each other in the third direction D3, and partially overlap with each other in the third direction D3. For example, the first transistor and the second transistor are a threshold compensation transistor T3 and a light-emitting control transistor connected with the light-emitting element in the pixel circuit 10, respectively. For example, the light-emitting control transistor connected with the light-emitting element is the second light-emitting control transistor T5. Of course, in other embodiments of the present disclosure, the block or the connection arm that forms the capacitor with the conductive portion CP in the first transistor in the pixel island may also use other forms, which is not limited herein.

For example, referring to FIG. 19, in an embodiment of the present disclosure, the block BK0 (the branch of the second sub-portion Lb) and the connection arm L21 are both connected to the third conductive line L3 of a current column of pixel units, and the block BK is connected to the third conductive line in a column of pixel units that is adjacent to a column of pixel units of which the conductive portion is covered by the block BK. That is, as illustrated in FIG. 19, the block BK0 (the branch of the second sub-portion Lb), the connection arm L21, and the block BK are all connected to the same third conductive line L3.

For example, as illustrated in FIG. 11, the initialization signal line 210 includes a plurality of hollowed-out regions HP, the second conductive line L2 is located in one hollowed-out region HP, and is surrounded by the part of the initialization signal line that defines the hollowed-out region HP, and the second conductive line L2 does not overlap with the part of the initialization signal line that defines the hollowed-out region HP. That is, the second conductive line L2 is completely surrounded by the part of the initialization signal line that defines the hollowed-out region HP. In an embodiment of the present disclosure, the hollowed-out region HP is a position corresponding to the part of the film that is removed when forming the initialization signal line 210.

For example, referring to FIG. 11, FIG. 13 and FIG. 19, the first conductive line L1 includes a first part L11 and a second part L12, the first part L11 of the first conductive line L1 is located in the same layer as the second conductive line L2, and the second part L12 of the first conductive line L1 is not located in the same layer as the second conductive line L2, and the second part L12 of the first conductive line L1 at least partially overlaps with the initialization signal line 210. Referring to FIG. 11, FIG. 13 and FIG. 19, the first part L11 of the first conductive line L1 and the second conductive line L2 are both located in the second conductive pattern layer LY2, and the second part L12 of the first conductive line L1 is located in the third conductive pattern layer LY3.

For example, referring to FIG. 11, FIG. 13 and FIG. 19, the second conductive line L2 is surrounded by a part of the initialization signal line 210, and the first part L11 of the first conductive line L1 is surrounded by a part of the initialization signal line 210. Referring to FIG. 11, FIG. 13 and FIG. 19, the second conductive line L2 is surrounded by a part 210*a* of the initialization signal line 210 located at the lower side, and the first part L11 of the first conductive line L1 is surrounded by a part 210*b* of the initialization signal line 210 located at the upper side.

For example, referring to FIG. 3 and FIG. 19, the data line 313 includes a first data line DL1, the first data line DL1 extends from the first display region R1 to the second display region R2, and an orthographic projection of the first data line DL1 on the base substrate BS partially overlaps with an orthographic projection of the third conductive line L3 on the base substrate BS. This arrangement mode is beneficial for reducing the wiring area and improving the light transmittance.

For example, referring to FIG. 13, FIG. 18 and FIG. 19, the first data line DL1 includes a first part DL11 (as shown in FIG. 18 and FIG. 19) and a second part DL12 (as shown in FIG. 13 and FIG. 19), the first part DL11 of the first data line DL1 partially overlaps with the third conductive line L3, and the second part DL12 of the first data line DL1 does not overlap with the third conductive line L3, and the first part DL11 of the first data line DL1 and the second part DL12 of the first data line DL1 are located in different layers, respectively. For example, in FIG. 19, the first part DL11 (a conductive line 214) of the first data line DL1 on the left side is located in the second conductive pattern layer, and the second part DL12 of the first data line DL1 on the left side is located in the third conductive pattern layer. In FIG. 19, the first part DL11 (a conductive line 114) of the first data line DL1 on the right side is located in the first conductive pattern layer, and the second part DL12 of the first data line DL1 on the right side is located in the third conductive pattern layer. For example, referring to FIG. 19 and FIG. 23, the first part DL11 of the first data line DL1 is located between adjacent pixel islands A1.

For example, referring to FIG. 13 and FIG. 19, two first data lines DL1 are provided, the two first data lines DL1 are connected with two adjacent columns of pixel units, respectively, and orthographic projections of the two first data lines DL1 on the base substrate BS overlap with an orthographic projection of the same third conductive line L3 on the base substrate BS. This arrangement mode makes the data line located between pixel islands in two adjacent columns of pixel units hidden under the third line, thereby reducing the wiring area and improving the light transmittance.

For example, the first conductive line L1 includes parts located in different layers, and the parts located in different layers are connected through a via hole that penetrates an insulation layer. Referring to FIG. 19, the first conductive line L1 includes a first part L11, a second part L12, and a third part L13. The first part L11 and the third part L13 are located in the second conductive pattern layer LY2, and the second part L12 is located in the third conductive pattern layer LY3. The first part L11 and the second part L12 are connected through a via hole V41 that penetrates an insulation layer, and the third part L13 and the second part L12 are connected through a via hole V42 that penetrates the insulation layer. Referring to FIG. 24 and FIG. 25, an interlayer dielectric layer ILD is provided between the second conductive pattern layer LY2 and the third conductive pattern layer LY3, that is, the via hole V41 penetrates the interlayer dielectric layer ILD, and the via hole V42 penetrates the interlayer dielectric layer ILD.

For example, referring to FIG. 19, a part (the second part L12) of the first conductive line L1 and the third conductive line L3 are located in the same layer, and are both located in the third conductive pattern layer LY3. The fourth conductive line L4 and the third conductive line L3 are located in the same layer, and are both located in the third conductive pattern layer LY3.

At least one embodiment of the present disclosure further provides a display device, including any of the above display panels. For example, the display device may be a display device such as an Organic Light-Emitting Diode (OLED) display device, and any product or component with a display function including the display device, such as a TV, a digital camera, a mobile phone, a watch, a tablet computer, a notebook computer, and a navigator.

For example, in an embodiment of the present disclosure, the first conductive line L1 may include a part located in the first conductive pattern layer and a part located in the second conductive pattern layer, the second conductive line L2 is only composed of a part located in the second conductive pattern layer, the third conductive line L3 is only composed of a part located in the third conductive pattern layer, the fourth conductive line L43 is only composed of only a part located in the third conductive pattern layer, and the fifth conductive line L5 may include a part located in the first conductive pattern layer and a part located in the second conductive pattern layer, but not limited thereto, which can be provided as required.

For example, referring to FIG. 11 and FIG. 19, in an embodiment of the present disclosure, a second electrode C12 of the storage capacitor C1 of the pixel unit P0 is a part of the second conductive line L2 or a part of the first conductive line L1.

The following statements should be noted.

(1) Unless otherwise defined, the same reference numeral refers to the same meaning in the embodiments and the drawings of the present disclosure.

(2) The accompanying drawings involve only the structure(s) in connection with the embodiment(s) of the present disclosure, and other structure(s) can be referred to common design(s).

(3) For the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

(4) In the case of no conflict, the features in the same embodiment and different embodiments of the present disclosure can be combined with each other.

The above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:

a first display region;

a second display region, located at least on one side of the first display region;

a plurality of pixel units, located in the first display region and the second display region, a density of a part of the plurality of pixel units located in the first display region being less than that of another part of the plurality of pixel units located in the second display region, and each of the plurality of pixel units comprising a pixel circuit; and a first power supply line, configured to supply a first voltage signal to the pixel circuit, wherein the first power supply line comprises a plurality of first conductive lines, a plurality of second conductive lines, and a plurality of third conductive lines, each of the plurality of first conductive lines extends from the second display region to the first display region, each of the plurality of second conductive lines is located in the first display region and located between adjacent ones of the plurality of first conductive lines, each of the plurality of second conductive lines extends in a first direction, each of the plurality of third conductive lines extends in a second direction, and the first direction intersects with the second direction, and adjacent ones of the plurality of second conductive lines are spaced apart from each other in the first direction, and one of the plurality of second conductive lines is connected with one of the plurality of first conductive lines by one of the plurality of third conductive lines, wherein the part of the plurality of pixel units located in the first display region constitute a plurality of pixel islands, each of the plurality of pixel islands at least comprises two pixel units located in two adjacent rows, one of the plurality of first conductive lines and one of the plurality of second conductive lines overlap with the two pixel units located in the two adjacent rows, respectively, the display panel further comprises a base substrate and a data line, wherein the data line is configured to supply a data signal to the pixel circuit, and the data line comprises a first data line, wherein the first data line extends from the first display region to the second display region, and an orthographic projection of the first data line partially overlaps with an orthographic projection of one of the plurality of third conductive lines on the base substrate, wherein the first data line comprises a first part and a second part that are located in different layers, respectively, a light transmission region is provided between adjacent ones of the plurality of pixel islands, and the first part of the first data line is located between the adjacent ones of the plurality of pixel islands.

2. The display panel according to claim 1, wherein the plurality of second conductive lines are sequentially arranged in the first direction.

3. The display panel according to claim 1, wherein the adjacent ones of the plurality of second conductive lines are not directly connected.

4. The display panel according to claim 1, wherein a length of a part of one of the plurality of first conductive lines located in the first display region in the first direction is greater than that of one of the plurality of second conductive lines in the first direction.

5. The display panel according to claim 1, wherein one of the plurality of second conductive lines and an adjacent one of the plurality of first conductive lines have a first distance, the one of the plurality of second conductive lines and an adjacent second one of the plurality of first conductive lines have a second distance, and the first distance is different from the second distance.

6. The display panel according to claim 1, wherein the first power supply line further comprises a fourth conductive line, the fourth conductive line extends in the second direction, one of the plurality of second conductive lines is connected to one of the plurality of first conductive lines by the fourth conductive line, and a length of the fourth conductive line in the second direction is less than or equal to that of one of the plurality of third conductive lines in the second direction.

7. The display panel according to claim 1, wherein a plurality of fourth conductive lines are provided, the plurality of fourth conductive lines are located between adjacent ones of the plurality of third conductive lines, and the plurality of fourth conductive lines are sequentially arranged in the second direction, and adjacent ones of the plurality of fourth conductive lines are spaced apart from each other in the second direction.

8. The display panel according to claim 6, wherein the fourth conductive line is located in a same layer as one of the plurality of third conductive lines.

9. The display panel according to claim 1, wherein the first direction is perpendicular to the second direction.

10. The display panel according to claim 1, wherein the first power supply line further comprises a fifth conductive line, the fifth conductive line extends in the first direction, and the fifth conductive line is located in the second display region, the fifth conductive line is located between adjacent ones of the plurality of first conductive lines, and the fifth conductive line and one of the plurality of second conductive lines adjacent thereto are spaced apart from each other in the first direction.

11. The display panel according to claim 1, further comprising an initialization signal line configured to supply an initialization signal to the pixel circuit, wherein one of the plurality of second conductive lines is surrounded by a part of the initialization signal line.

12. The display panel according to claim 1, wherein two first data lines are provided, the two first data lines are connected with two adjacent columns of pixel units among the plurality of pixel units, respectively, and orthographic projections of the two first data lines partially overlap with an orthographic projection of a same third conductive line on the base substrate.

13. A display device, comprising the display panel according to claim 1, wherein the display device further comprises a sensor, the sensor is located on a side of the display panel, and overlaps with the first display region.

14. The display panel according to claim 1, wherein one of the plurality of pixel units comprises a first channel and a second channel, the first channel and the second channel are connected by a conductive portion, wherein one of the plurality of first conductive lines has a branch, and the branch and the conductive portion of one pixel unit in one of the plurality of pixel islands that overlaps with one of the plurality of first conductive lines are spaced apart from each other in a third direction, and partially overlap with each other in the third direction.

15. The display panel according to claim 1, further comprising a gate line, wherein the gate line is configured to supply a scan signal to a row of pixel units, the gate line comprises a first gate line, the first gate line extends from the second display region to the first display region, and the light transmission region is defined by two adjacent first gate lines and two adjacent first data lines.

16. A display panel, comprising:

a first display region;

a second display region, located at least on one side of the first display region;

a plurality of pixel units, located in the first display region and the second display region, a density of a part of the plurality of pixel units located in the first display region being less than that of another part of the plurality of pixel units located in the second display region, and each of the plurality of pixel units comprising a pixel circuit; and a first power supply line, configured to supply a first voltage signal to the pixel circuit, wherein the first power supply line comprises a plurality of first conductive lines, a plurality of second conductive lines, and a plurality of third conductive lines, each of the plurality of first conductive lines extends from the second display region to the first display region, each of the plurality of second conductive lines is located in the first display region and located between adjacent ones of the plurality of first conductive lines, each of the plurality of second conductive lines extends in a first direction, each of the plurality of third conductive lines extends in a second direction, and the first direction intersects with the second direction, and adjacent ones of the plurality of second conductive lines are spaced apart from each other in the first direction, and one of the plurality of second conductive lines is connected with one of the plurality of first conductive lines by one of the plurality of third conductive lines, wherein the part of the plurality of pixel units located in the first display region constitute a plurality of pixel islands, each of the plurality of pixel islands at least comprises two pixel units located in two adjacent rows, one of the plurality of first conductive lines and one of the plurality of second conductive lines overlap with the two pixel units located in the two adjacent rows, respectively, wherein one of the plurality of pixel units comprises a first channel and a second channel, the first channel and the second channel are connected by a conductive portion, wherein one of the plurality of first conductive lines has a branch, and the branch and the conductive portion of one pixel unit in one of the plurality of pixel islands that overlaps with one of the plurality of first conductive lines are spaced apart from each other in the third direction a third direction, and partially overlap with each other in the third direction.

17. The display panel according to claim 16, further comprising a base substrate and a data line, wherein the data line is configured to supply a data signal to the pixel circuit, and the data line comprises a first data line, wherein the first data line extends from the first display region to the second display region, and an orthographic projection of the first data line partially overlaps with an orthographic projection of one of the plurality of third conductive lines on the base substrate, wherein the first data line comprises a first part and a second part that are located in different layers, respectively, a light transmission region is provided between adjacent ones of the plurality of pixel islands, and the first part of the first data line is located between the adjacent ones of the plurality of pixel islands.

18. The display panel according to claim 17, wherein one of the plurality of third conductive lines is located in a same layer as the second part of the first data line.

19. The display panel according to claim 18, wherein a length of one of the plurality of third conductive lines is greater than that of the first part of the first data line.

20. A display panel, comprising:

a first display region;

a second display region, located at least on one side of the first display region;

a plurality of pixel units, located in the first display region and the second display region, a density of a part of the plurality of pixel units located in the first display region being less than that of another part of the plurality of pixel units located in the second display region, and each of the plurality of pixel units comprising a pixel circuit; and a first power supply line, configured to supply a first voltage signal to the pixel circuit, wherein the first power supply line comprises a plurality of first conductive lines, a plurality of second conductive lines, and a plurality of third conductive lines, each of the plurality of first conductive lines extends from the second display region to the first display region, each of the plurality of second conductive lines is located in the first display region and located between adjacent ones of the plurality of first conductive lines, each of the plurality of second conductive lines extends in a first direction, each of the plurality of third conductive lines extends in a second direction, and the first direction intersects with the second direction, and adjacent ones of the plurality of second conductive lines are spaced apart from each other in the first direction, and one of the plurality of second conductive lines is connected with one of the plurality of first conductive lines by one of the plurality of third conductive lines, wherein the part of the plurality of pixel units located in the first display region constitute a plurality of pixel islands, each of the plurality of pixel islands at least comprises two pixel units located in two adjacent rows, one of the plurality of first conductive lines and one of the plurality of second conductive lines overlap with the two pixel units located in the two adjacent rows, respectively, the display panel further comprises a base substrate and a data line, wherein the data line is configured to supply a data signal to the pixel circuit, and the data line comprises a first data line, wherein the first data line extends from the first display region to the second display region, and an orthographic projection of the first data line partially overlaps with an orthographic projection of one of the plurality of third conductive lines on the base substrate, the display panel further comprises a gate line, wherein the gate line is configured to supply a scan signal to a row of pixel units among the plurality of pixel units, the gate line comprises a first gate line, the first gate line extends from the second display region to the first display region, and a light transmission region is defined by two adjacent first gate lines and two adjacent first data lines.

* * * * *